United States Patent [19]
Takeuchi et al.

[11] Patent Number: 6,005,802
[45] Date of Patent: *Dec. 21, 1999

[54] NONVOLATILE SEMICONDUCTOR MEMORY DEVICE USING A BIT LINE POTENTIAL RAISED BY USE OF A COUPLING CAPACITOR BETWEEN BIT LINES

[75] Inventors: Ken Takeuchi, Tokyo; Tomoharu Tanaka, Yokohama; Hiroshi Nakamura, Kawasaki, all of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/167,551

[22] Filed: Oct. 7, 1998

[30] Foreign Application Priority Data

Oct. 9, 1997 [JP] Japan .................................. 9-277036

[51] Int. Cl.$^6$ .................................................. G11C 16/06
[52] U.S. Cl. ............................... 365/185.02; 365/185.17; 365/185.21; 365/185.25
[58] Field of Search .......................... 365/185.02, 185.17, 365/185.21, 185.25

[56] References Cited

U.S. PATENT DOCUMENTS 5,379,256  1/1995  Tanaka et al. ..................... 365/185.17

OTHER PUBLICATIONS

"A 3.3 V 32 Mb NAND Flash Memory", Kang–Deog Suh et al.; IEEE International Solid–State Circuits Conference; 1995; pp. 128–129.

"A 35ns–Cycle–Time 3.3 V Only 32 Mb NAND Flash EEPROM", Kenichi Imamiya et al.; IEEE International Solid–State Circuits Conference; 1995 pp. 130–131.

IEDM 97, "A Triple Polysilicon Stacked Flash Memory Cell with Self–Booosting Programming", Jung Dal Choi et al, pp. 285–286.

*Primary Examiner*—Andrew Tran
*Attorney, Agent, or Firm*—Banner & Witcoff, Ltd.

[57] ABSTRACT

A nonvolatile semiconductor memory device includes a memory cell section including at least one nonvolatile memory cell, a first bit line connected to one end of the memory cell section, and a second bit line capacitively coupled with the first bit line. At the data programming time, the first bit line is set to a first voltage, thereafter rendered electrically floating, the voltage of the second bit line is changed to a second voltage after the first bit line is rendered electrically floating, and then the first bit line which is set in the electrically floating state is capacitively coupled with second bit line to change the voltage of the first bit line to a third voltage higher than the first and second voltages.

28 Claims, 18 Drawing Sheets

NONVOLATILE SEMICONDUCTOR MEMORY DEVICE USING A BIT LINE POTENTIAL RAISED BY USE OF A COUPLING CAPACITOR BETWEEN BIT LINES

BACKGROUND OF THE INVENTION

This invention relates to an electrically rewritable nonvolatile semiconductor memory device and more particularly to a nonvolatile semiconductor memory device for raising a bit line potential of floating writing type by use of a coupling capacitor between bit lines to a level equal to or higher than a power supply voltage and using the same.

Recently, as one of electrically erasable and programmable read only memory devices (EEPROMs), a NAND type EEPROM is proposed. The EEPROM has a plurality of memory cells each having an n-channel MOSFET structure in which, for example, a floating gate used as a charge storage layer and a control gate are stacked and a preset number of memory cells are serially connected with the sources and drains commonly used by the adjacent memory cells and are connected to the bit line as one unit. One end of the series-connected memory cells is connected to the bit line via a selection transistor and the other end thereof is connected to a source line via another selection transistor.

The data programming, data erasing and data readout operations in the NAND type EEPROM are effected as follows.

First, the data programming process is effected for the series-connected memory cells starting from the memory cell which lies farthest apart from the bit line. A voltage of 0 V ("0" programming) or an external power supply voltage Vcc ("1" programming) is applied to the bit line according to the programming data. If an internal power supply voltage Vdd is created by lowering the external power supply voltage Vcc in the chip and used, 0 V ("0" programming) or the internal power supply voltage Vdd ("1" programming) is applied to the bit line. In this case, the external power supply voltage Vcc (or the internal power supply voltage Vdd) applied to the bit line is generally called a programming non-selection voltage.

The gate voltage of the selection transistor connected to the bit line is set at "Vcc" (or "Vdd") and the gate voltage of the selection transistor connected to the source line is set at "0 V". At this time, in the "0" programming process, the selection transistor connected to the bit line is turned ON and "0 V" is transmitted to the channel of the cell into which "0" is programmed. Further, in the "1" programming process, the selection transistor connected to the bit line is turned OFF and the voltage of the channel of the cell into which "1" is programmed becomes "Vcc−Vthsg" (or Vdd−Vthsg:Vthsg is the threshold voltage of the selection transistor) and the channel is set into the electrically floating state.

After this, a raised programming voltage Vpgm (=approx. 20 V) is applied to the control gate of the cell selected for programming and an intermediate voltage Vpass (=approx. 10 V) is applied to the control gates of other programming non-selected cells and the gates of the selection transistors. As a result, if programming data is "0", the channel voltage is 0 V, and therefore, a high voltage is applied between the floating gate and the p-type well region of the selected cell so as to cause electrons to be injected from the p-type well region into the floating gate by the tunnel effect. on the other hand, if programming data is "1", the voltage of the channel in the floating state is raised to approx. 6 V by the capacitive coupling with the control gate, and no electrons are injected and the threshold voltage is not shifted.

The data erasing operation is simultaneously effected for each block unit. That is, the voltages of the control gates of all of the cells of the block in which data is erased and the gates of the selection transistors are set to "0 V " and a raised erase voltage VEE (=approx. 20 V) is applied to the p-type well region and n-type substrate. As a result, in the cells of the block in which data is erased, electrons in the floating gates are discharged into the p-type well region and the threshold voltages are shifted in the negative direction.

The data readout operation is effected by precharging the bit line and then setting the bit line in the electrically floating state, setting the voltage of the control gate of the cell selected for readout to "0 V", setting the voltages of the control gates of the other cells and the voltages of the gates of the selection transistors to the external power supply voltage Vcc (or the internal power supply voltage Vdd; "Vcc" and "Vdd" are both set at approx. 3 V), setting the voltage of the source line to 0 V, and determining whether or not a current flows in the channel of the cell selected for readout by use of the bit line. That is, since the cell is set in the "OFF" state if data programmed in the cell is "0" (the threshold voltage Vth of the cell>0), the voltage of the bit line is kept at the precharge voltage. In contrast, since the cell is set in the "ON" state if data programmed in the cell is "1" (the threshold voltage Vth of the cell<0), the voltage of the bit line is lowered from the precharge voltage by ΔV. By sensing and amplifying such a voltage variation of the bit line by use of the sense amplifier, data of "0" or "1" is read out from the cell.

In the conventional data programming method described above, the voltage of the channel is set to an intermediate voltage of approx. 6 V by the capacitive coupling between the control gate and the channel at the "1" programming time. However, if the capacitance associated with the diffused layer of the cell is larger than the capacitance between the control gate and the channel, the voltage of the channel will be raised by approx. 3 V even if the voltage of the control gate is set to 10 V. As a result, the voltage difference between the control gate and the channel is small and "erroneous programming" may occur in the cell in which "1" is to be programmed.

In order to suppress the possibility that "erroneous programming" may occur in the cell in which "1" is to be programmed, it is considered that the programming non-selection voltage applied to the bit line at the "1" programming time is set to be higher than the external power supply voltage Vcc or internal power supply voltage Vdd.

However, in this case, it is necessary to additionally provide a high voltage generating circuit for generating a voltage higher than Vcc or Vdd. If such a high voltage generating circuit is mounted on the chip, the chip area is greatly increased. Further, if the programming non-selection voltage higher than the voltage Vcc or Vdd is applied from the high voltage generating circuit to the bit line at the "1" programming time, time for charging the bit line takes a long time since the capacitance associated with the bit line is large, and as a result, the data programming speed becomes low.

Particularly, the capacitance associated with the bit line in the NAND type EEPROM is relatively larger than that in the other semiconductor memories. The reason is as follows.

In the NAND type EEPROM, great importance is attached to how small the chip is and how large the integrated memory capacity is. For this reason, unlike the DRAM in which great importance is attached to the high-speed operation, for example, the memory cell array is not finely divided and the number of divisions of the memory cell array is set as small as possible. This is because the number of peripheral circuits such as row decoders and sense amplifiers is suppressed to minimum.

Therefore, if the high voltage generating circuit for setting the programming non-selection voltage higher than the voltage Vcc or Vdd at the "1" programming time is provided for the NAND type EEPROM, time for charging the bit line takes a long time and the current consumption becomes extremely large.

Further, if the EEPROM is operated by the internal power supply voltage Vdd, for example, a large current flows when 4000 bit lines are charged at the programming time and there occurs a possibility that the internal power supply voltage Vdd will be lowered. That is, in order to further enhance the breakdown voltage of the internal transistors as the semiconductor memory is more miniaturized, the internal power supply voltage Vdd is obtained by lowering the external power supply voltage Vcc by use of a voltage lowering circuit. Since the voltage lowering circuit also functions as a resistor element between the external power supply voltage Vcc and the internal power supply voltage Vdd, a lowering in the internal power supply voltage Vdd when the bit line is precharged increases in comparison with a case wherein the voltage lowering circuit is not used and Vcc=Vdd.

In order to cancel the lowering in the internal power supply voltage Vdd at the time of precharging of the bit lines, the number of divisions of the memory cell array is increased to reduce the length of each bit line, but in this case, the numbers of row decoders and sense amplifiers are increased and the chip area becomes large.

BRIEF SUMMARY OF THE INVENTION

Accordingly, an object of this invention is to provide a nonvolatile semiconductor memory device with which high-speed data programming can be effected without increasing the chip area.

Further, another object of this invention is to provide a nonvolatile semiconductor memory device with which charging time of bit lines can be reduced and the power consumption can be reduced.

Still another object of this invention is to provide a nonvolatile semiconductor memory device in which the erroneous programming operation occurring in the "1" programming cell (programming non-selection cell) connected to a word line selected for programming can be suppressed.

Further, an object of this invention is to provide a nonvolatile semiconductor memory device in which a lowering in the internal power supply voltage can be suppressed.

The above object can be attained by a nonvolatile semiconductor memory device comprising a memory cell section including at least one nonvolatile memory cell; a first signal line connected to one end of the memory cell section; and a second signal line capacitively coupled with the first signal line; wherein the first signal line is set to a first voltage, thereafter rendered electrically floating, and then the voltage of the first signal line is changed to a third voltage different from the first voltage by changing the voltage of the second signal line to a second voltage after the first signal line is rendered electrically floating.

With the above construction, by changing the voltage of the second signal line to the second voltage after the first signal line is set into the electrically floating state, the first signal line which is set in the electrically floating state is capacitively coupled with the second signal line. Therefore, the voltage of the first signal line is changed to the third voltage different from the first voltage. For example, if the second voltage is a positive voltage, the third voltage is a voltage higher than the first voltage. Since the third voltage is obtained by capacitive coupling, the voltage of the first signal line can be changed to the third voltage in a shorter period of time in comparison with a system in which a third voltage higher than the first voltage is applied to the first signal line. Thus, the data programming speed can be enhanced.

Further, since the third voltage can be obtained without using a high voltage generating circuit, the chip area will not be increased and the current consumption will not be increased.

Since the third voltage can be set to a voltage higher than the first voltage, the possibility of erroneous programming in the cell (programming non-selection cell) in which "1" is programmed and which is connected to the word line selected for programming can be suppressed.

The above object can also be attained by a nonvolatile semiconductor memory device comprising a memory cell section including at least one nonvolatile memory cell; a first signal line connected to one end of the memory cell section; and a second signal line capacitively coupled with the first signal line; wherein the first signal line is set to a first voltage, thereafter rendered electrically floating, and then the voltage of the first signal line is changed from the first voltage to an unselected programming voltage by changing the voltage of the second signal line to a second voltage after the first signal line is rendered electrically floating.

In the above nonvolatile semiconductor memory device, the voltage of the second signal line is changed to the second voltage after the first signal line is set into the electrically floating state. Thus, the first signal line which is set in the electrically floating state is capacitively coupled with the second signal line and the voltage of the first signal line is changed to the programming non-selection voltage which is different from the first voltage.

For example, if the second voltage is a positive voltage, the programming non-selection voltage is a voltage higher than the first voltage. Since the programming non-selection voltage is obtained by capacitive coupling, the voltage of the first signal line can be changed to the programming non-selection voltage higher than the first voltage in a shorter period of time in comparison with a system in which a programming non-selection voltage higher than the first voltage is applied to the first signal line. Thus, the data programming speed can be enhanced.

Further, since the programming non-selection voltage higher than the first voltage can be obtained without using a high voltage generating circuit, the chip area will not be increased and the current consumption will not be increased.

Since the programming non-selection voltage higher than the first voltage can be set to a voltage higher than the first voltage, the possibility of erroneous programming in the cell (programming non-selection cell) in which "1" is programmed and which is connected to the word line selected for programming can be suppressed.

The above object can also be attained by a nonvolatile semiconductor memory device comprising a memory cell section including at least one nonvolatile memory cell; a first signal line connected to one end of the memory cell section; and a second signal line capacitively coupled with the first signal line; wherein the first signal line is set to a first voltage, thereafter rendered electrically floating, and the voltage of the first signal line is changed to a third voltage different from the first voltage by changing the voltage of the second signal line to a second voltage after the first signal line is rendered electrically floating, and then the first signal line and the second signal line are connected to each other to set the voltages of the first and second signal lines to an unselected programming voltage after the voltage of the first signal line is set to the third voltage.

With the above construction, not only the first voltage of the first signal line but also the second voltage of the second signal line can be set to the programming non-selection voltage different from the first voltage.

Further, the above object can also be attained by a nonvolatile semiconductor memory device comprising a memory cell section including at least one nonvolatile memory cell; a first signal line connected to one end of the memory cell section; a second signal line capacitively coupled with the first signal line; and a data latch circuit for storing data to be programmed into the memory cell section; wherein the first signal line is set to a first voltage, thereafter rendered electrically floating, then the voltage of the first signal line is changed to a third voltage different from the first voltage by changing the voltage of the second signal line to a second voltage after the first signal line is rendered electrically floating, and the voltage of the first signal line is changed to a preset programming voltage according to programming data stored in the data latch circuit after the voltage of the first signal line is changed to the third voltage.

In the above nonvolatile semiconductor memory device, the voltage of the first signal line is set to the preset data programming voltage from the data latch circuit after the voltage of the first signal line is set to the third voltage different from the first voltage. Therefore, a variation in the internal power supply voltage can be suppressed in comparison with a case wherein the first signal line is set at the first voltage and the voltage of the first signal line is set to the preset data programming voltage from the data latch circuit, for example.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
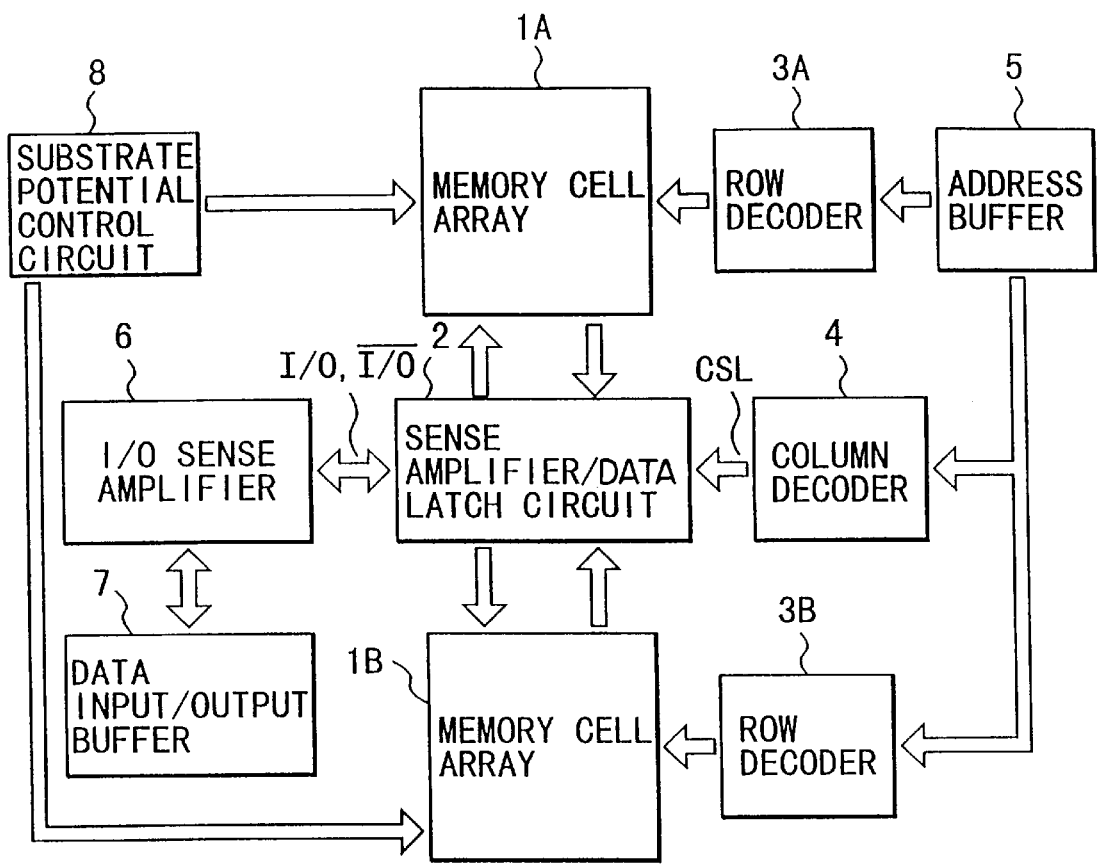
FIG. 1 is a block diagram showing the schematic construction of a NAND type EEPROM, for illustrating a nonvolatile semiconductor memory device according to a first embodiment of this invention.

There will now be described a nonvolatile semiconductor memory device according to a first embodiment of this invention by taking a NAND type EEPROM as an example. FIG. 1 is a block diagram showing the schematic construction of the NAND type EEPROM. The NAND type EEPROM includes memory cell arrays 1A, 1B, sense amplifier/data latch circuit 2, row decoders 3A, 3B, column decoder 4, address buffer 5, I/O sense amplifier 6, data input/output buffer 7 and substrate potential control circuit 8. The EEPROM is an open bit line type and the memory cell array for storing data is divided into two memory cell arrays. The sense amplifier/data latch circuit 2 is used for programming or reading out data and senses, amplifies and latches data. The row decoders 3A, 3B respectively select word lines in the memory cell arrays 1A, 1B. The address buffer 5 latches an input address signal, supplies a row address signal to the row decoders 3A, 3B and supplies a column address signal to the column decoder 4. The I/O sense amplifier 6 senses and amplifies an output signal of the sense amplifier/data latch circuit 2 and supplies the output signal to the exterior via the data input/output buffer 7. Data input to the data input/output buffer 7 is supplied to the memory cell arrays 1A, 1B via the I/O sense amplifier 6 and sense amplifier/data latch circuit 2. The substrate potential control circuit 8 controls the substrate potentials of the memory cell arrays 1A, 1B.

Figure 2:
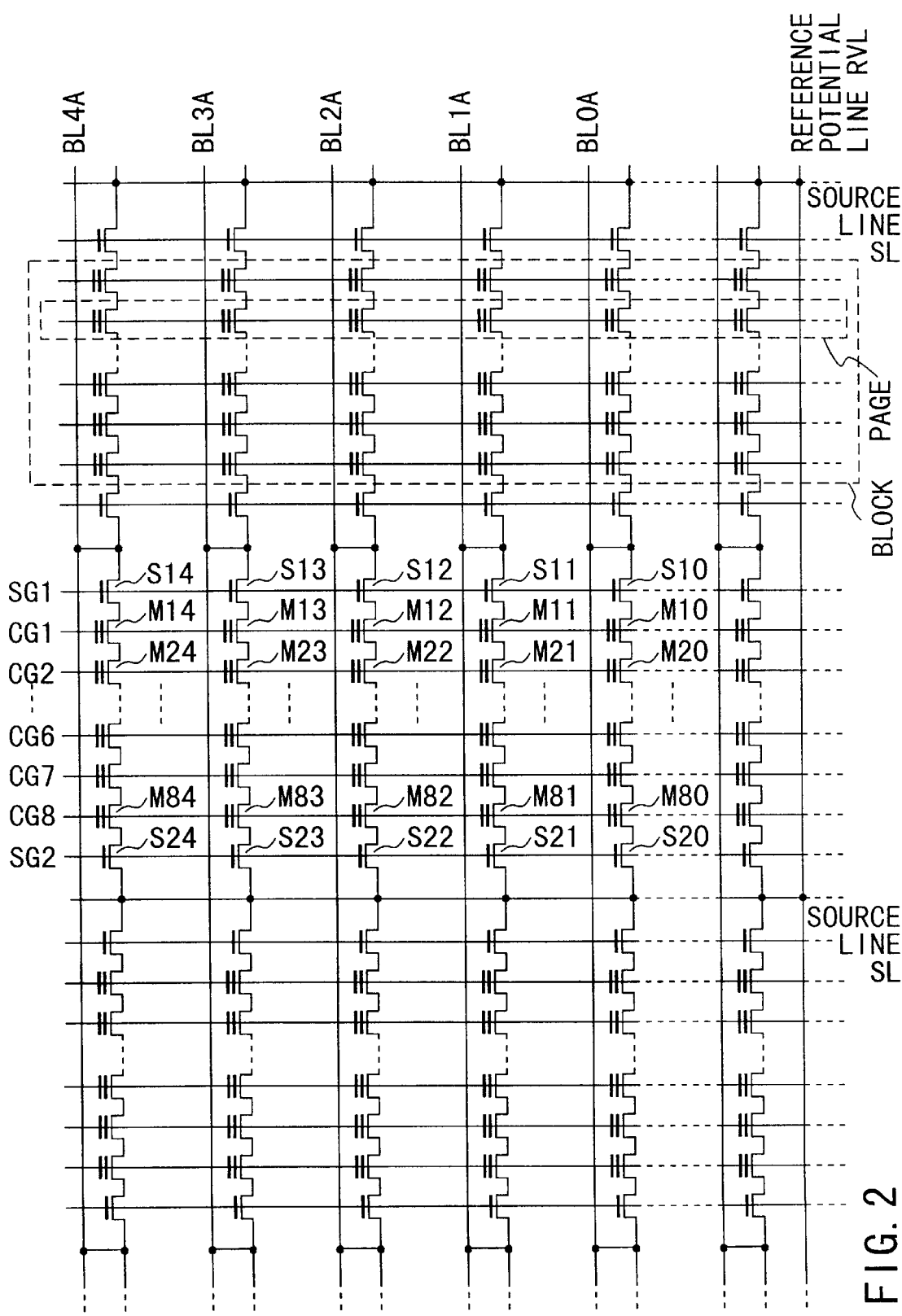
FIG. 2 is a circuit diagram showing an example of the construction of a memory cell array in the circuit shown in FIG. 1.

FIG. 2 is a circuit diagram showing an example of the construction of the memory cell array 1A in the circuit shown in FIG. 1. The NAND type EEPROM has a plurality of memory cells M10 to M80, M11 to M81, . . . with the n-channel MOSFET structure in which the floating gate acting as a charge storage layer and the control gate are stacked and a preset number of memory cells are serially connected with the sources and drains thereof commonly used by the adjacent memory cells and the series circuit of the memory cells is used as one unit and connected to a corresponding one of the bit lines BL0A, BL1A, . . . . The current paths of selection transistors S10, S11, . . . are respectively connected between the bit lines BL0A, BL1A, . . . and one-side ends of the current paths of the series-connected memory cells M10 to M80, M11 to M81, . . . and the current paths of selection transistors S20, S21, . . . are respectively connected between a source line SL and the other ends of the current paths of the memory cells M10 to M80, M11 to M81, . . . . For example, the source line SL is connected to a reference potential line RVL formed of aluminum or conductive polysilicon, for example, via a contact formed in one portion for every 64 bit lines. The reference potential line RVL is connected to a memory peripheral circuit (not shown). The peripheral circuit includes a source line control circuit for controlling the state of the source line SL according to the modes of data programming, data erasing and data readout, for example. Control gate lines CG1 to CG8 of the memory cells and selection gate lines SG1, SG2 are continuously formed in the row direction. Generally, a set of the memory cells connected to the control gate line is called a "page" and the set of "pages" defined by a pair of selection gate lines SG1 and SG2 is called a "NAND block" or simply a "block". For example, one page is constructed by cells of 256 bytes (256×8) and memory cells of one page are substantially simultaneously subjected to the data programming process. For example, one block is constructed by cells of 2048 bytes (2048×8) and memory cells of one block are substantially simultaneously subjected to the data erasing process.

The memory cell array 1B is also constructed with the same construction as the memory cell array 1A shown in FIG. 2.

Figure 3A:
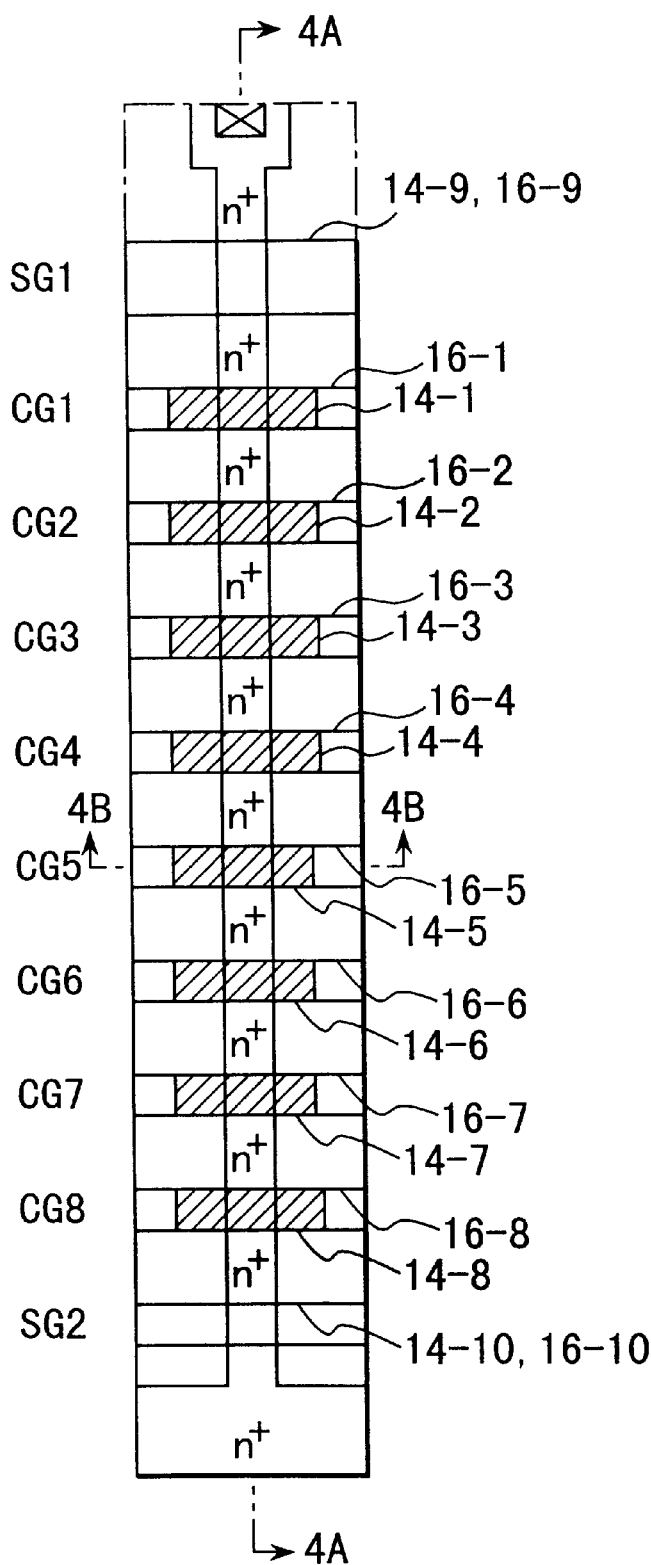
FIG. 3A is a pattern plan view of a NAND type cell in the circuit shown in FIG. 2.
Figure 3B:
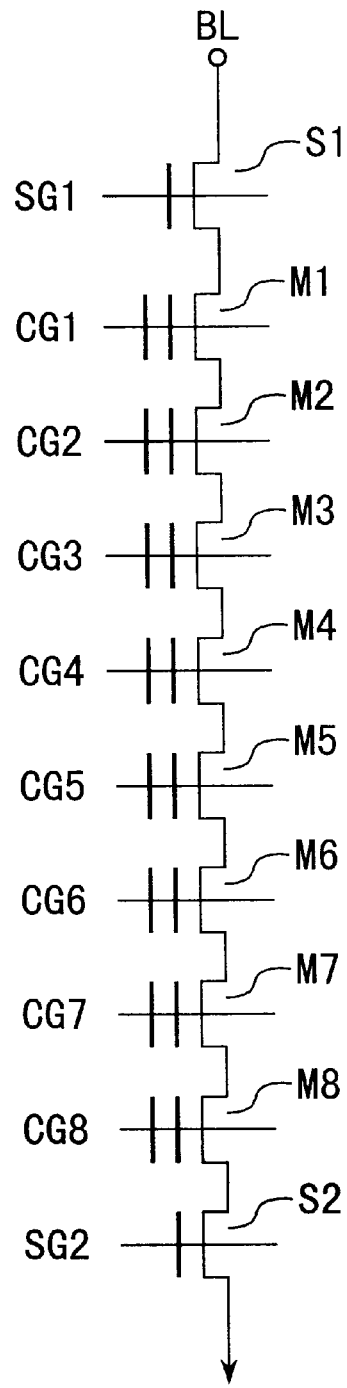
FIG. 3B is a circuit diagram showing the NAND type cell shown in FIG. 3A.
Figure 4A:
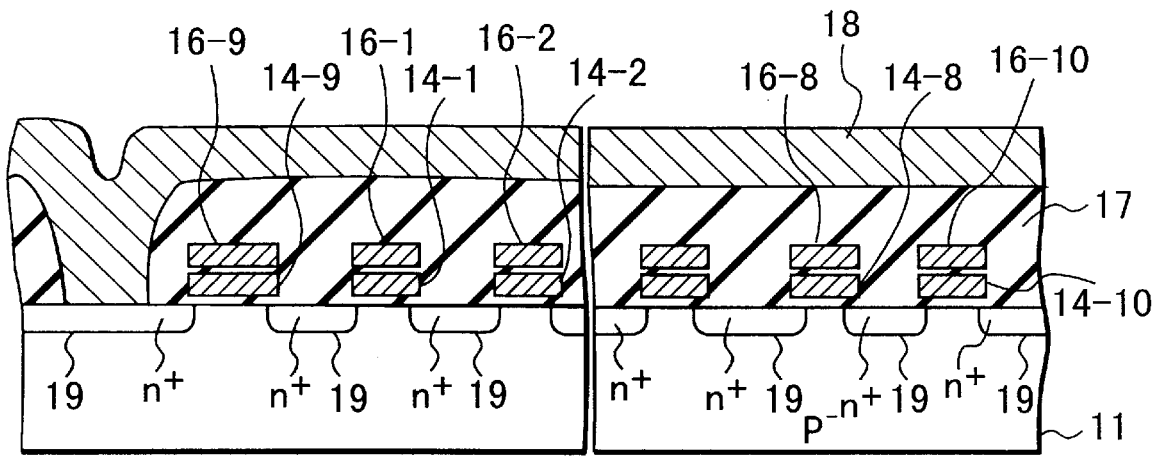
FIG. 4A is a cross sectional view taken along the line 4A—4A of the pattern shown in FIG. 3A.
Figure 4B:
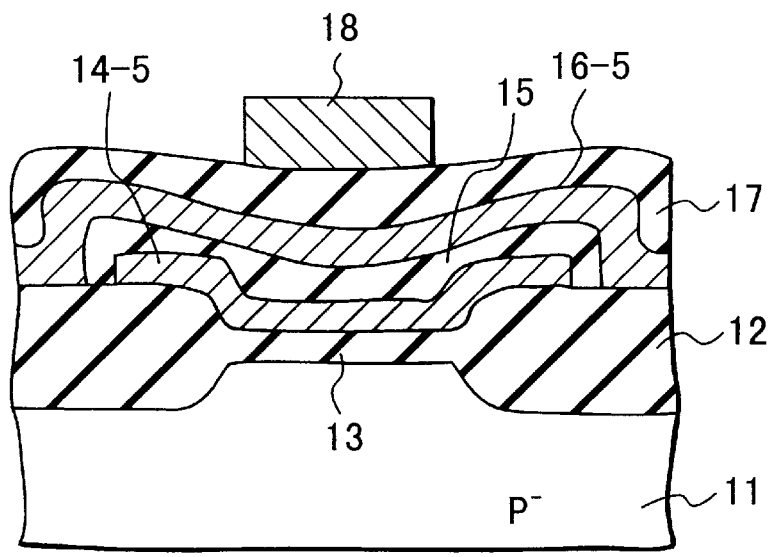
FIG. 4B is a cross sectional view taken along the line 4B—4B of the pattern shown in FIG. 3A.

FIG. 3A is a pattern plan view showing one unit of the NAND cell, and FIG. 3B is a circuit diagram thereof. FIG. 4A is a cross sectional view taken along the line 4A—4A of the pattern of FIG. 3A, and FIG. 4B is a cross sectional view taken along the line 4B—4B of the pattern of FIG. 3A. In this example, eight memory cells M1 to M8 are serially connected to constitute one unit of NAND cell. An element isolation oxide film 12 is formed for element isolation on the main surface of a p⁻-type silicon substrate (or p⁻-type well region) 11. Each of the memory cells M1 to M8 has a stacked gate structure including a floating gate 14 (14-1 to 14-8) formed above the substrate 11 with a first gate insu-lating film 13 disposed therebetween and a control gate 16 (16-1 to 16-8) formed above the floating gate 14 with a second gate insulating film 15 disposed therebetween. In this case, n⁺-type diffused layers 19 which are sources/drains of the cells are commonly used by the adjacent cells, and as a result, the current paths of the memory cells M1 to M8 are serially connected.

A first selection transistor S1 is connected to the drain side of the NAND cell and a second selection transistor S2 is connected to the source side thereof. The selection transistor S1 has stacked gate structure members 14-9, 16-9 which are formed at the same time as the floating gates 14-1 to 14-8 and the control gates 16-1 to 16-8 and the selection transistor S2 has similar stacked gate structure members 14-10, 16-10. The gate structure members 14-9, 16-9 of the selection transistor S1 and the gate structure members 14-10, 16-10 of the selection transistor S2 are connected to each other in adequate positions (not shown) and respectively function as the gate electrodes of the selection transistors S1 and S2. The substrate 11 on which the above elements are formed is covered with a CVD oxide film 17 and a bit line (BL) 18 is formed on the CVD oxide film 17. The control gates 16-1 to 16-8 of the cells M1 to M8 are continuously formed in the row direction and are used as the control gate lines CG1 to CG8 each commonly used for the same row, for example, and function as word lines. Further, the stacked gate structure members 14-9, 16-9 of the selection transistor S1 and the stacked gate structure members 14-10, 16-10 of the selection transistor S2 are also formed continuously in the row direction and commonly used for the same row and function as the selection gate lines SG1, SG2.

Figure 5:
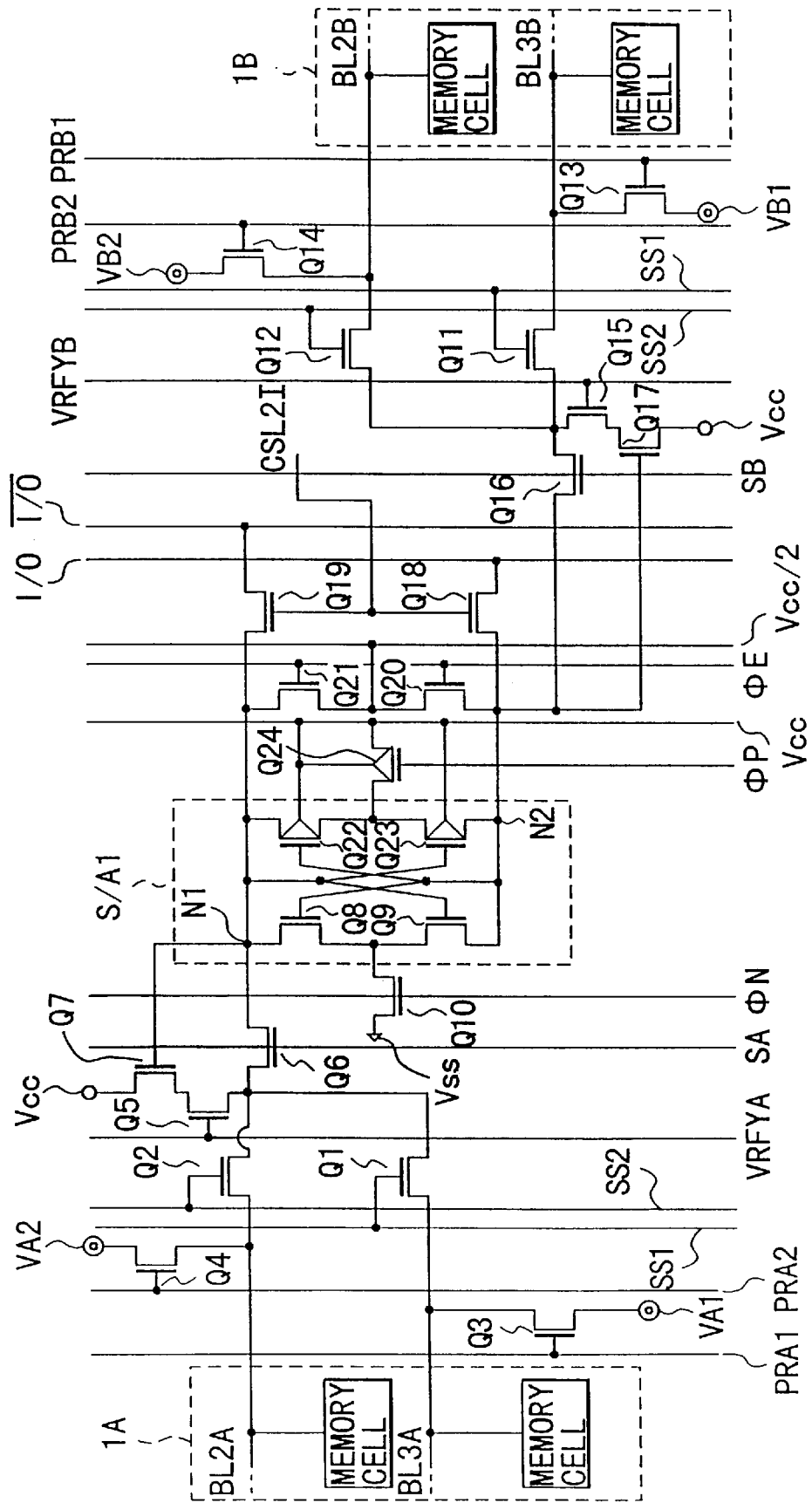
FIG. 5 is a circuit diagram showing an example of the construction of a sense amplifier/data latch circuit in the circuit shown in FIG. 1.

FIG. 5 is a circuit diagram showing an example of the construction of the sense amplifier/data latch circuit 2 shown in FIG. 1. In FIG. 5, portions of the sense amplifier/data latch circuit 2 to which the bit lines BL2A, BL3A shown in FIG. 2 are connected are extracted. The circuit 2 includes n-channel transistors Q1 to Q21 and p-channel transistors Q22 to Q24. One-side ends of the current paths of the transistors Q1, Q2 are connected to the bit lines BL3A, BL2A in the memory cell array 1A. The gate of the transistor Q1 is supplied with a signal SS1 and the gate of the transistor Q2 is supplied with a signal SS2. The current path of the transistor Q3 is connected between the bit line BL3A and a node of voltage VA1 and the gate thereof is supplied with a precharge signal PRA1. The current path of the transistor Q4 is connected between the bit line BL2A and a node of voltage VA2 and the gate thereof is supplied with a precharge signal PRA2. The other ends of the current paths of the transistors Q1, Q2 and one-side ends of the current paths of the transistors Q5, Q6 are commonly connected to each other. The gate of the transistor Q5 is supplied with a verify signal VRFYA and the gate of the transistor Q6 is supplied with a signal SA. The current path of the transistor Q7 is connected between the other end of the transistor Q5 and the power supply Vcc and the gate thereof is connected to the node N1 of a sense amplifier circuit S/A1.

Likewise, one-side ends of the current paths of the transistors Q11, Q12 are connected to the bit lines BL3B, BL2B in the memory cell array 1B. The gate of the transistor Q11 is supplied with the signal SS1 and the gate of the transistor Q12 is supplied with the signal SS2. The current path of the transistor Q13 is connected between the bit line BL3B and a node of voltage VB1 and the gate thereof is supplied with a precharge signal PRB1. The current path of the transistor Q14 is connected between the bit line BL2B and a node of voltage VB2 and the gate thereof is supplied with a precharge signal PRB2. The other ends of the current paths of the transistors Q11, Q12 and one-side ends of the current paths of the transistors Q15, Q16 are commonly connected to each other. The gate of the transistor Q15 is supplied with a verify signal VRFYB and the gate of the transistor Q16 is supplied with a signal SB. The current path of the transistor Q17 is connected between the other end of the current path of the transistor Q15 and the power supply Vcc and the gate thereof is connected to the node N2 of the sense amplifier circuit S/A1.

The sense amplifier circuit S/A1 includes the transistors Q8, Q9, Q22, Q23. One-side ends of the current paths of the transistors Q8, Q22 are connected to the node N1 and the gates thereof are connected to the node N2. One-side ends of the current paths of the transistors Q9, Q23 are connected to the node N2 and the gates thereof are connected to the node N1. The other ends of the current paths of the transistors Q8 and Q9 are commonly connected to each other and the other ends of the current paths of the transistors Q22 and Q23 are commonly connected to each other.

One end of the current path of the transistor Q10 is connected to the connection node of the current paths of the transistors Q8 and Q9, the other end of the current path thereof is connected to a ground node Vss, and the gate thereof is supplied with a signal φN. One end of the current path of the transistor Q24 is connected to the connection node of the current paths of the transistors Q22 and Q23, the other end of the current path thereof is connected to the power supply Vcc, and the gate thereof is supplied with a signal φP. The back-gates of the p-channel transistors Q22, Q23, Q24 are connected to the power supply Vcc. In other words, the power supply voltage Vcc is applied to the n-type well region in which the p-channel transistors Q22, Q23, Q24 are formed.

Further, one end of the current path of the transistor Q18 is connected to the node N2 of the sense amplifier circuit S/A1 and the other end thereof is connected to the input/output line I/O. One end of the current path of the transistor Q19 is connected to the node N1 of the sense amplifier circuit S/A1 and the other end thereof is connected to the input/output line $\overline{I/O}$. A signal CSL2I is supplied to the gates of the transistors Q18, Q19. The current path of the transistor Q20 is connected between the node N2 and a node of the power supply voltage Vcc/2 (which is half the power supply voltage Vcc) and a signal φE is supplied to the gate thereof. The current path of the transistor Q21 is connected between the node N1 and the node of the power supply voltage Vcc/2 and the signal φE is supplied to the gate thereof.

The data erasing operation and data readout operation in the NAND type EEPROM are the same as those disclosed in, for example, "T. Tanaka et al.: IEEE J. Solid-State Circuit, vol. 29, pp. 1366–1373, 1994". Therefore, the explanation for the erasing operation and readout operation is omitted.

Next, the data programming operation in the EEPROM according to the first embodiment is explained with reference to the timing chart of FIG. 6. In this explanation, the programming procedure for programming data into the memory cell M12 shown in FIG. 2 is taken as an example. As shown in FIG. 5, in the sense amplifier/data latch circuit 2, two bit lines are commonly used by one sense amplifier circuit S/A1. Therefore, one of the two bit lines is selected. When data is programmed into the memory cell M12, the cells M11 and M13 which are adjacent to the memory cell M12 are set into the programming non-selection state. Data to be programmed into the memory cell M12 is supplied via the bit line BL2A and programming non-selection voltages are applied to the respective cells M11 and M13 via the bit lines BL1A and BL3A. Data to be programmed into the memory cell M12 is latched in the sense amplifier circuit S/A1 shown in FIG. 5. That is, in the case of "0" programming, the node N1 of the sense amplifier circuit S/A1 is set at "0 V" and the node N2 is set at "3 V", and in the case of "1" programming, the node N1 is set at "3 V" and the node N2 is set at "0 V".

Figure 6:
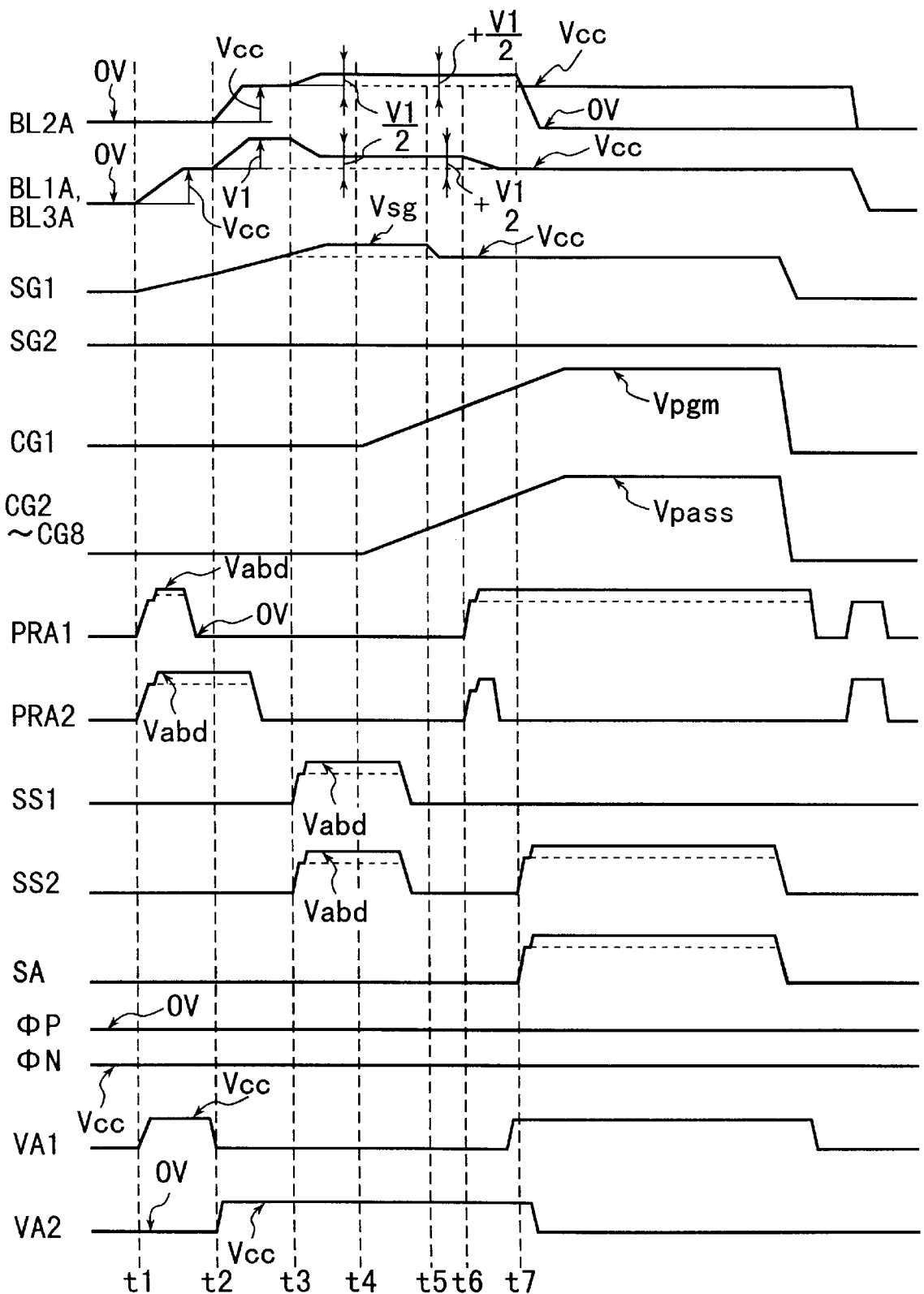
FIG. 6 is a timing chart for illustrating the programming operation of the NAND type EEPROM shown in FIGS. 1 to 5.
Figure 7A:
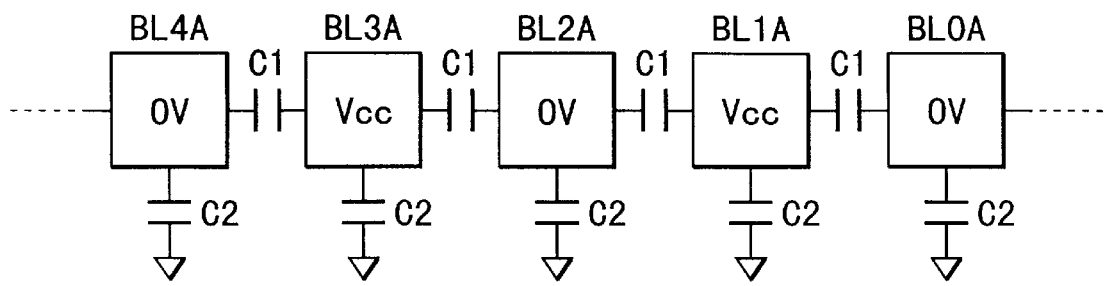
FIGS. 7A to 7D are equivalent circuit diagrams showing a variation in the voltage of the bit line during the programming operation of the NAND type EEPROM.
Figure 7B:
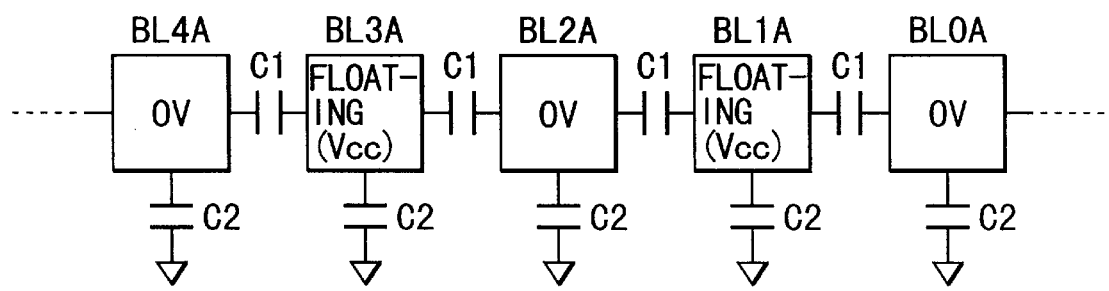

If the programming operation is started, the voltages of the precharge signals PRA1, PRA2 are set to "Vabd" at the time t1 shown in FIG. 6. At this time, the voltage VA1 is "Vcc" and the voltage VA2 is "0 V". The voltage Vabd may be such a voltage, for example, approx. 8 V for charging the bit lines BL1A, BL3A to the voltage Vcc (for example, 3 V). Thus, the voltages of the bit lines BL0A to BL4A are alternately set at "Vcc". More specifically, the voltages of the bit lines BL1A, BL3A are charged to "Vcc" and the voltages of the bit lines BL0A, BL2A, BL4A are set at "0 V". The voltage relation between the bit lines obtained at this time is shown in the equivalent circuit of FIG. 7A. The capacitor C1 shown in FIG. 7A is a capacitor between the bit lines and the capacitor C2 is a capacitor associated with the bit line other than the capacitor between the bit lines. The capacitance of the capacitor C2 is almost twice that of the capacitor C1. After this, as shown in FIG. 7B, the voltage of the precharge signal PRA1 is set to "0 V" to set the bit lines BL1A, BL3A applied with the voltage Vcc into the electrically floating state.

The bit line is charged to the voltage Vcc because the charging operation can be directly effected from the power supply without using a high voltage generating circuit. Therefore, the operation for charging the bit lines BL1A, BL3A to the voltage Vcc can be effected at high speed like the normal EEPROM. Further, since the high voltage generating circuit is not necessary, the current consumption will not increase.

Figure 7C:
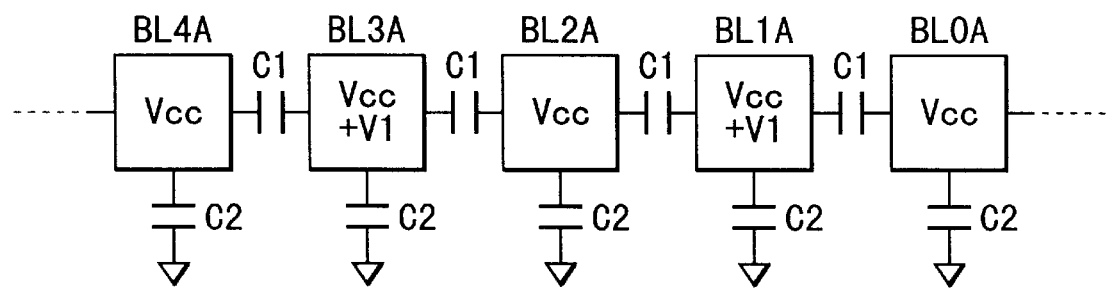

Then, at the time t2, the voltage VA2 is set to "Vcc" to charge the remaining bit lines BL0A, BL2A, BL4A to "Vcc". At this time, since the bit lines BL1A, BL3A are set in the electrically floating state, the voltages of the bit lines BL1A, BL3A are raised from "Vcc" to "Vcc+V1" by the capacitive coupling by the capacitor Cl as shown in FIG. 7C. The voltage V1 is set at (C2/(2C1+C2))·Vcc, that is, approx. Vcc/2.

Figure 7D:
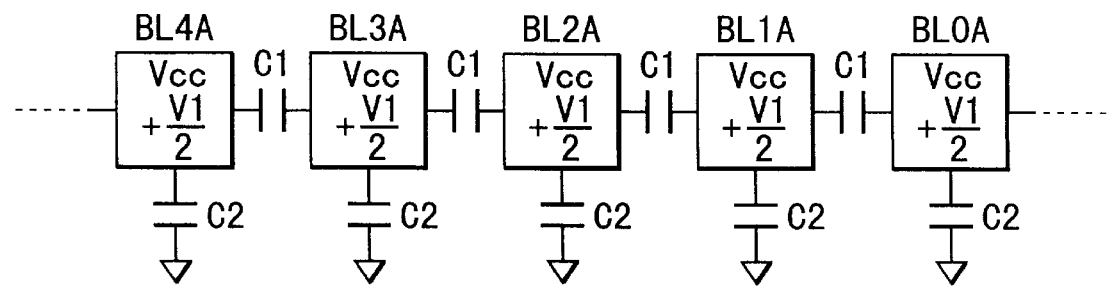

Next, at the time t3, the voltages of the signals SS1, SS2 are set to "Vabd" to short-circuit or directly connect the bit line BL2A to which programming data is supplied to the bit line BL3A non-selected for programming in FIG. 5. As a result, as shown in FIG. 7D, the voltages of all of the bit lines are set to a voltage "Vcc+(V1/2)" which is higher than the voltage Vcc. In this embodiment, the voltage "Vcc+(V1/2)" is the programming non-selection voltage of the bit line.

In the first embodiment, the voltages of the signals SS1, SS2 are set to "Vabd" to short-circuit the bit line BL2A and the bit line BL3A to each other, but it is also possible to short-circuit all of the bit lines BL0A, BL1A, BL2A, BL3A, BL4A.

By the above operation, the programming non-selection voltage of the bit line can be set at the voltage "Vcc+(V1/2)" which is higher than the voltage Vcc. Further, the timings for setting the bit line voltages to the power supply voltage Vcc for the even-numbered bit lines are deviated with respect to the odd-numbered bit lines to generate the high voltage "Vcc+(V1/2)" applied to the bit lines, and therefore, a high voltage generating circuit is not necessary. Thus, the operation for setting the bit line voltage can be effected at higher speed in comparison with a case wherein the high voltage generating circuit is used. Of course, the chip area will not be greatly increased and the current consumption will not increase.

While the bit line voltage is being raised to the voltage Vcc or more, the voltage of the selection gate line SG1 is raised to "Vsg". The voltage Vsg may be set at "Vcc+(V1/2)", for example. Further, in this state, at the time t4, the voltage of the control gate line CG1 is set to Vpgm (=approx. 20 V) and the voltages of the control gate lines CG2 to CG8 are set to Vpass (=approx. 10 V). As a result, the channels of the cells MC11, MC12, MC13 are set into the floating state after the bit line potential "Vcc+(V1/2)" or "Vcc+(V1/2)−Vthsg (Vthsg is a threshold voltage of the selection transistor connected to the selection gate line SG1)" is transferred, and then, they are set to the programming non-selection channel voltage (programming inhibition voltage) raised by the capacitive coupling with the control gate. The programming non-selection channel voltage is approx. 8 V. As explained in "BACKGROUND OF THE INVENTION", the programming non-selection channel voltage was conventionally set at approx. 6 V. Therefore, in the first embodiment, the programming non-selection channel voltage can be increased by approx. 2 V in comparison with the conventional case.

After the bit line voltage "Vcc+(V1/2)" is fully transferred to the channels to raise the channel voltages of the cells MC1, MC12, MC13 and set the channel voltages to the programming non-selection channel voltages, the voltage of the selection gate line SG1 is lowered to "Vcc" at the time t5 and then the voltages of the bit lines BL1A, BL3A are set to "Vcc" at the time t6. The selection transistor S1 using the selection gate line SG1 as the gate thereof is turned OFF since the gate thereof is set at the voltage Vcc and the bit line is set at the voltage Vcc. Therefore, the channel voltage will not be lowered because of the leakage of charges from the channels of the cells MC11, MC12, MC13 into the bit lines. The reason why the selection gate line SG1 is set to the voltage Vcc before the bit line is set to the voltage Vcc is to prevent the leakage of charges from the channels of the cells into the bit lines.

Next, at the time t7, the data programming voltage "Vcc" or "Vss (0 V)" is applied to the bit line BL2A to which programming data is supplied according to programming data latched in the sense amplifier circuit S/A1. For example, if "0" programming is effected for the cell M12, the bit line BL2A is set at 0 V and the channel of the cell M12 is set at 0 V. In the case of "1" programming, the bit line BL2A is set at the voltage Vcc (for example, 3 V) to turn OFF the selection transistor S1 and the channel voltage of the cell M12 is kept at the programming non-selection channel voltage (intermediate voltage).

Further, the voltages of the programming non-selection bit lines BL1A, BL3A, BL5A are kept at the voltage Vcc. Therefore, the channel voltages of the cells M11, M13 are kept at the programming non-selection channel voltage (intermediate voltage) like the channel voltage of the cell M12 in which "1" is to be programmed.

After this, the voltage of the control gate line CG1 selected for programming is set to "Vpgm (=approx. 20 V)" and the voltages of the programming non-selection control gate lines CG2 to CG8 are raised to "Vpass (=approx. 10 V)", and then, as described above, the channel voltage of the cell M12 in which the "1" programming process is effected and the channel voltages of the programming non-selection cells M11, M13 are set at the intermediate voltage of approx. 8 V so that no electrons will be injected into the floating gate even if the voltage of the control gate line CG1 is set to "Vpgm (=approx. 20 V)". In contrast, since the channel voltage of the cell M12 in which the 0 programming process is effected is set at 0 V, electrons are injected from the substrate into the floating gate when the voltage of the control gate line CG1 is set to "Vpgm" and thus the "0" programming process is effected.

After the end of the programming process, the programming operation is terminated by sequentially discharging the control gate lines, selection gate lines and bit lines.

The timings of the programming process are not limited to the above case and can be variously modified. Some modifications are explained below.

In the above programming operation, the bit line BL2A and the bit line BL3A are short-circuited at the timing shown in FIG. 7D, but the short circuit is not always necessary. In this case, the voltage of the bit line BL2A does not become higher than Vcc, but since the non-selection bit line BL3A is set at the programming non-selection voltage (Vcc+V1) higher than Vcc at the timing shown in FIG. 7C, the erroneous programming characteristic of the memory cell connected to the bit line BL3A can be improved. In a case wherein the bit line BL2A and the bit line BL3A are not short-circuited, time required for short-circuiting can be omitted, and therefore, the programming speed can be enhanced.

Further, in the example of the above programming timing, the bit line BL3A is first set at "Vcc" and then the bit line BL2A is set at "Vcc". However, it is possible to first set the bit line BL2A at "Vcc" and then set the bit line BL3A at "Vcc".

Figure 8:
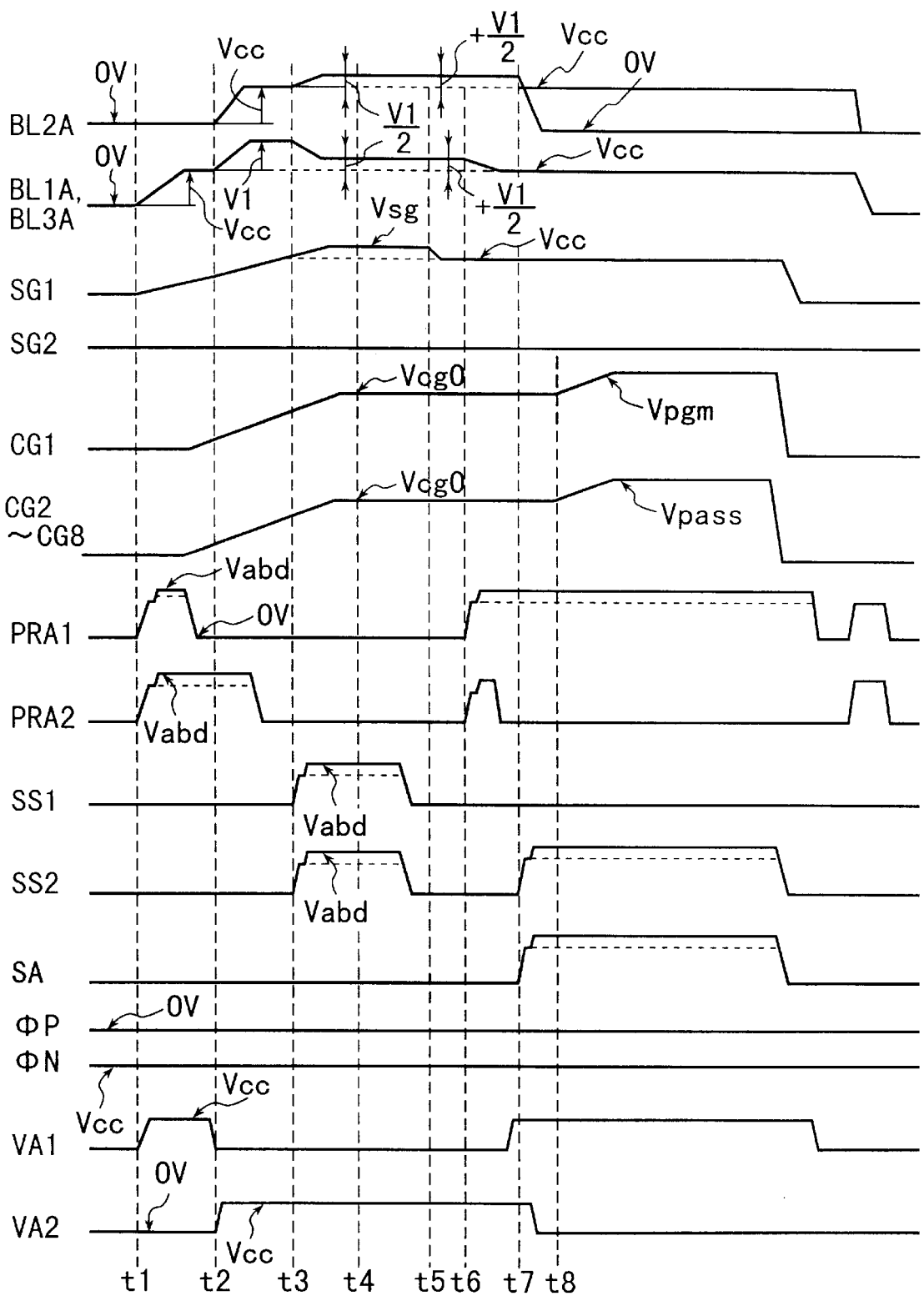
FIG. 8 is a timing chart for illustrating another programming operation of the NAND type EEPROM shown in FIGS. 1 to 5.

The timing shown in FIG. 8 may be used. In the example of the timing shown in FIG. 8, the selection gate line SG1 may be set to "Vsg (for example, Vcc+(V1/2)+2Vthsg)" and the control gate lines CG1, CG2 to CG8 may be set to "Vcg0" (for example, Vcc+(V1/2)+Vthcell:Vthcell is the threshold voltage of a memory cell set in the "0" state) in order to transfer the bit line potential "Vcc+(V1/2)" to the channel of the memory cell without causing a lowering in the voltage by the threshold voltage. In this case, the timing for raising the control gate lines CG1 to CG8 to "Vpass", "Vpgm" may be set at the time t8 as shown in FIG. 8 or the control gate lines CG1 to CG8 may be raised to "Vpass", "Vpgm" at the time t6 or t7 although not shown in the drawing.

Figure 9:
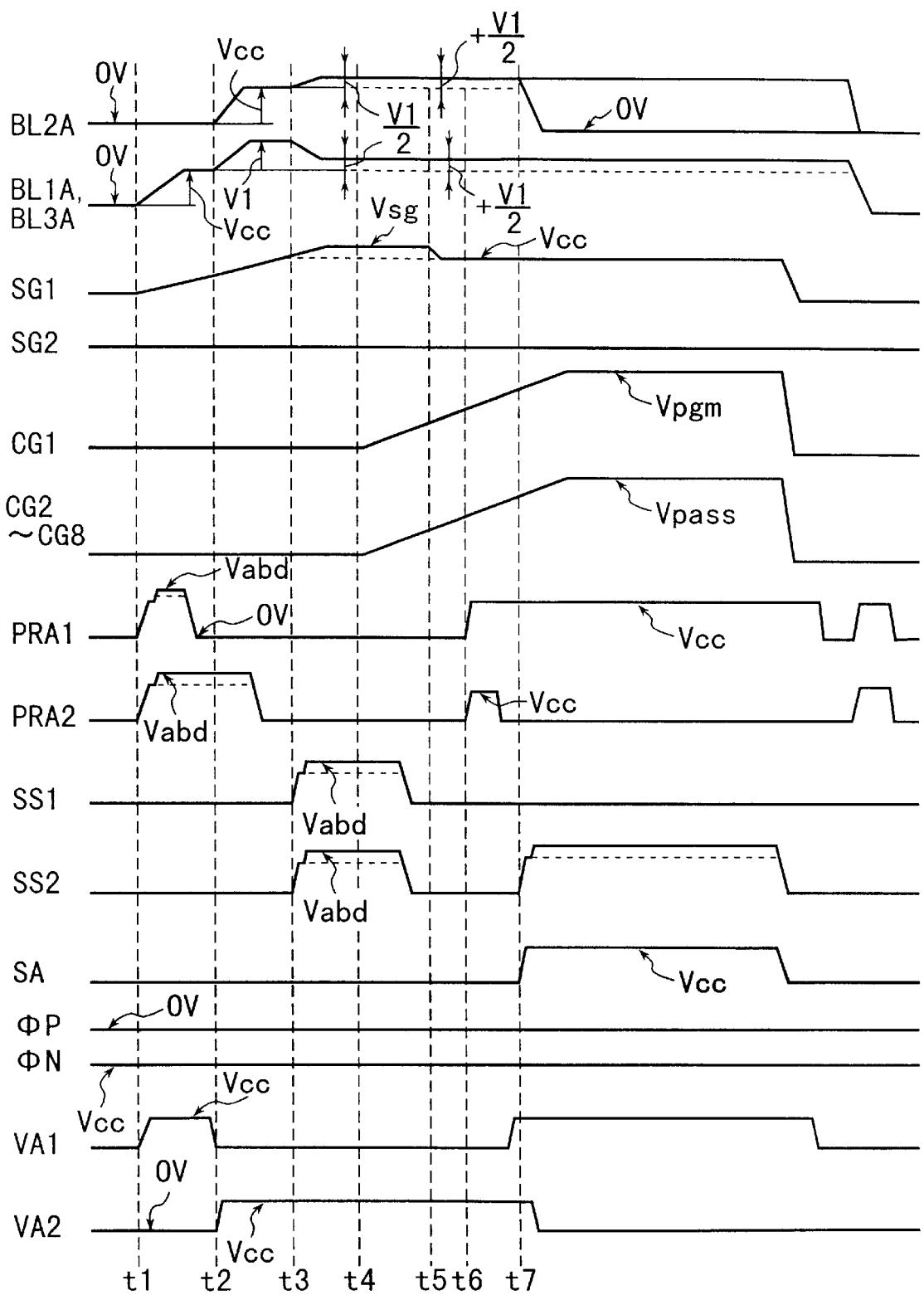
FIG. 9 is a timing chart for illustrating still another programming operation of the NAND type EEPROM shown in FIGS. 1 to 5.

Further, as shown in FIG. 9, the programming non-selection bit line potential "Vcc+(V1/2)" may be kept at "Vcc+(V1/2)" without being lowered to "Vcc".

Figure 10:
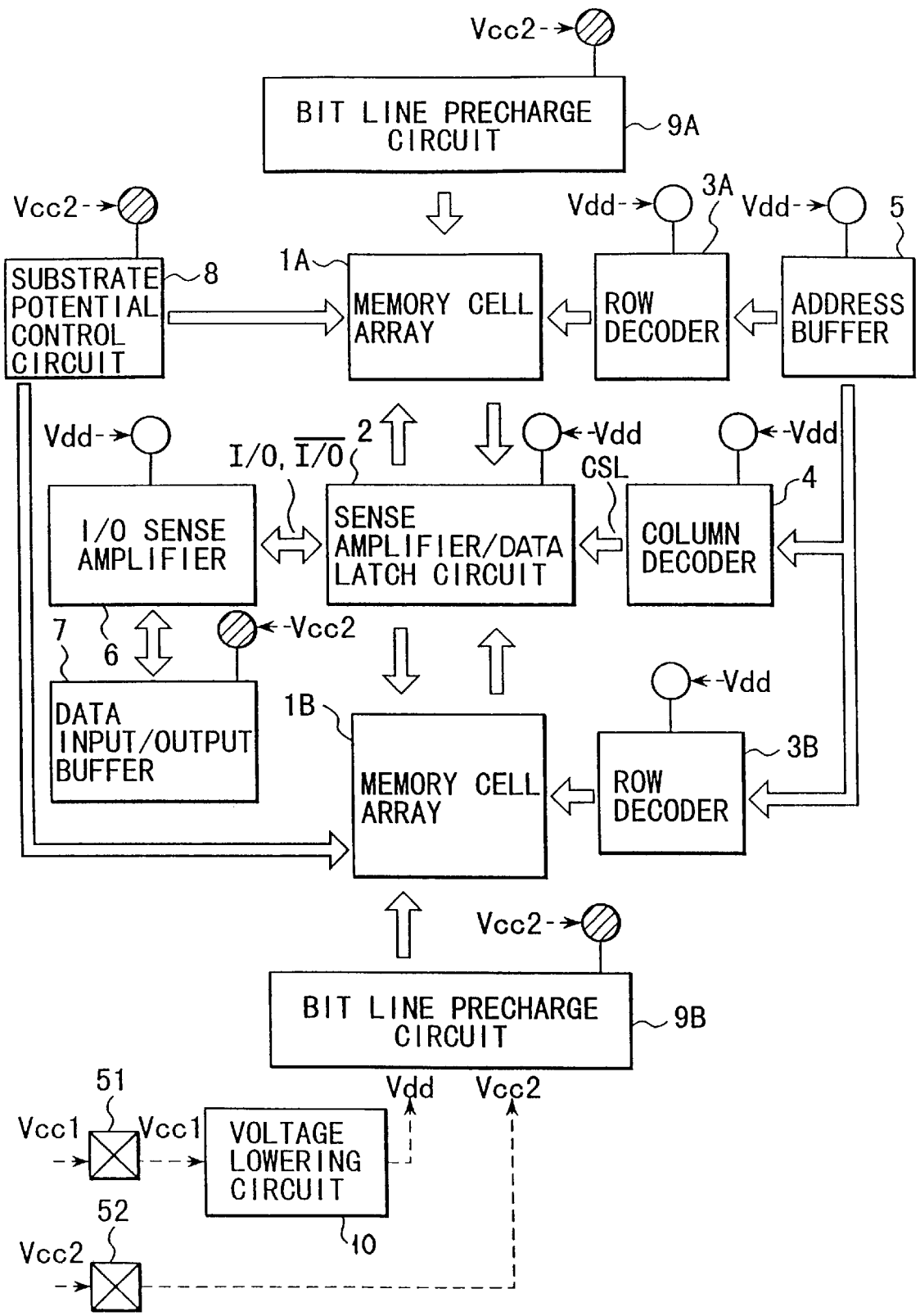
FIG. 10 is a block diagram showing the schematic construction of a NAND type EEPROM, for illustrating a nonvolatile semiconductor memory device according to a second embodiment of this invention.

Next, a nonvolatile semiconductor memory device according to a second embodiment of this invention is explained. FIG. 10 is a block diagram showing the construction of a NAND type EEPROM according to the second embodiment. The nonvolatile semiconductor memory device is a NAND type EEPROM in which the external power supply voltage Vcc is lowered by use of a voltage lowering circuit provided in the chip to produce an internal power supply voltage Vdd. The NAND type EEPROM includes memory cell arrays 1A, 1B, sense amplifier/data latch circuit 2, row decoders 3A, 3B, column decoder 4, address buffer 5, I/O sense amplifier 6, data input/output buffer 7, substrate potential control circuit 8, bit line precharge circuits 9A, 9B and voltage lowering circuit 10. The EEPROM is an open bit line type and the memory cell array for storing data is divided into two memory cell arrays. The sense amplifier/data latch circuit 2 is used for programming or reading out data and senses, amplifies and latches data. The row decoders 3A, 3B respectively select word lines in the memory cell arrays 1A, 1B. The address buffer 5 latches an input address signal, supplies a row address signal to the row address decoders 3A, 3B and supplies a column address signal to the column decoder 4. The I/O sense amplifier 6 senses and amplifies an output signal of the sense amplifier/data latch circuit 2 and supplies the output signal to the exterior via the data input/output buffer 7. Data input to the data input/output buffer 7 is supplied to the memory cell arrays 1A, 1B via the I/O sense amplifier 6 and sense amplifier/data latch circuit 2. The substrate potential control circuit 8 controls the substrate potentials of the memory cell arrays 1A, 1B. The bit line precharge circuit 9A precharges the bit lines in the memory cell array 1A and the bit line precharge circuit 9B precharges the bit lines in the memory cell array 1B. Two pads of the external power supply Vcc are provided, a first external Vcc pad 51 is supplied with an external power supply voltage Vcc1 and a second external Vcc pad 52 is supplied with an external power supply voltage Vcc2. The voltage Vcc1 supplied to the first pad 51 is supplied to the voltage lowering circuit 10 provided in the chip. The voltage lowering circuit 10 lowers the voltage Vcc1 to produce the internal power supply voltage Vdd.

The internal power supply voltage Vdd is supplied to the sense amplifier/data latch circuit 2, row decoders 3A, 3B, column decoder 4, address buffer 5 and I/O sense amplifier 6 in the circuit shown in FIG. 10 and the above circuits are driven by the voltage Vdd. The voltage Vcc2 supplied to the second external Vcc pad 52 is supplied to the data input/output buffer 7, substrate potential control circuit 8, bit line precharge circuits 9A, 9B and booster circuit (not shown) for generating a high voltage such as a programming voltage and the circuits are driven by the voltage Vcc2. The bit line precharge circuits 9A, 9B precharge the non-selection bit lines at the programming time by use of the external power supply voltage Vcc2 instead of the internal power supply voltage Vdd. For this reason, in the second embodiment, no voltage drop in the internal power supply voltage Vdd occurs.

The memory cell arrays 1A, 1B are formed with the same construction as the circuit shown in FIG. 2. Further, the NAND cells are the same as those of FIGS. 3A, 3B.

Figure 11:
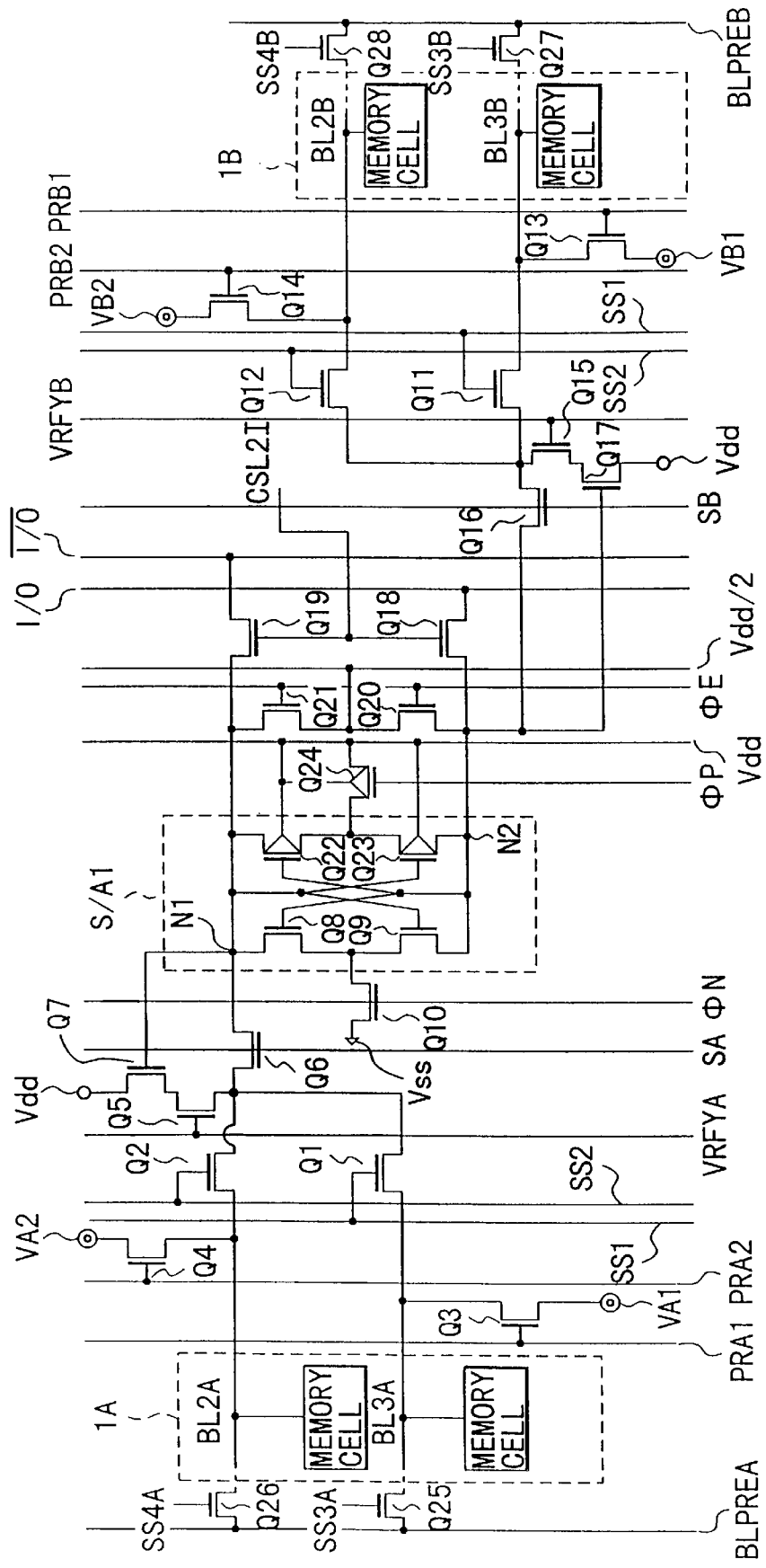
FIG. 11 is a circuit diagram showing an example of the construction of a sense amplifier/data latch circuit in the circuit shown in FIG. 10.

FIG. 11 is a circuit diagram showing an example of the construction of the sense amplifier/data latch circuit 2 shown in FIG. 10. The circuit 2 has basically the same construction as the circuit shown in FIG. 5, but the following construction is different. That is, the internal power supply voltage Vdd is supplied to one-side ends of the current paths of the transistors Q7, Q17 and a power supply voltage Vcc/2 is supplied to the connection node of the current paths of the transistors Q20 and Q21. The current paths of n-channel transistors Q25, Q26 are connected between the bit lines BL3A, BL2A and a precharge line BLPREA, and the current paths of n-channel transistors Q27, Q28 are connected between the bit lines BL3B, BL2B and a precharge line BLPREB. The gate of the transistor Q25 is supplied with a signal SS3A, the gate of the transistor Q26 is supplied with a signal SS4A, the gate of the transistor Q27 is supplied with a signal SS3B, and the gate of the transistor Q28 is supplied with a signal SS4B.

Figure 12:
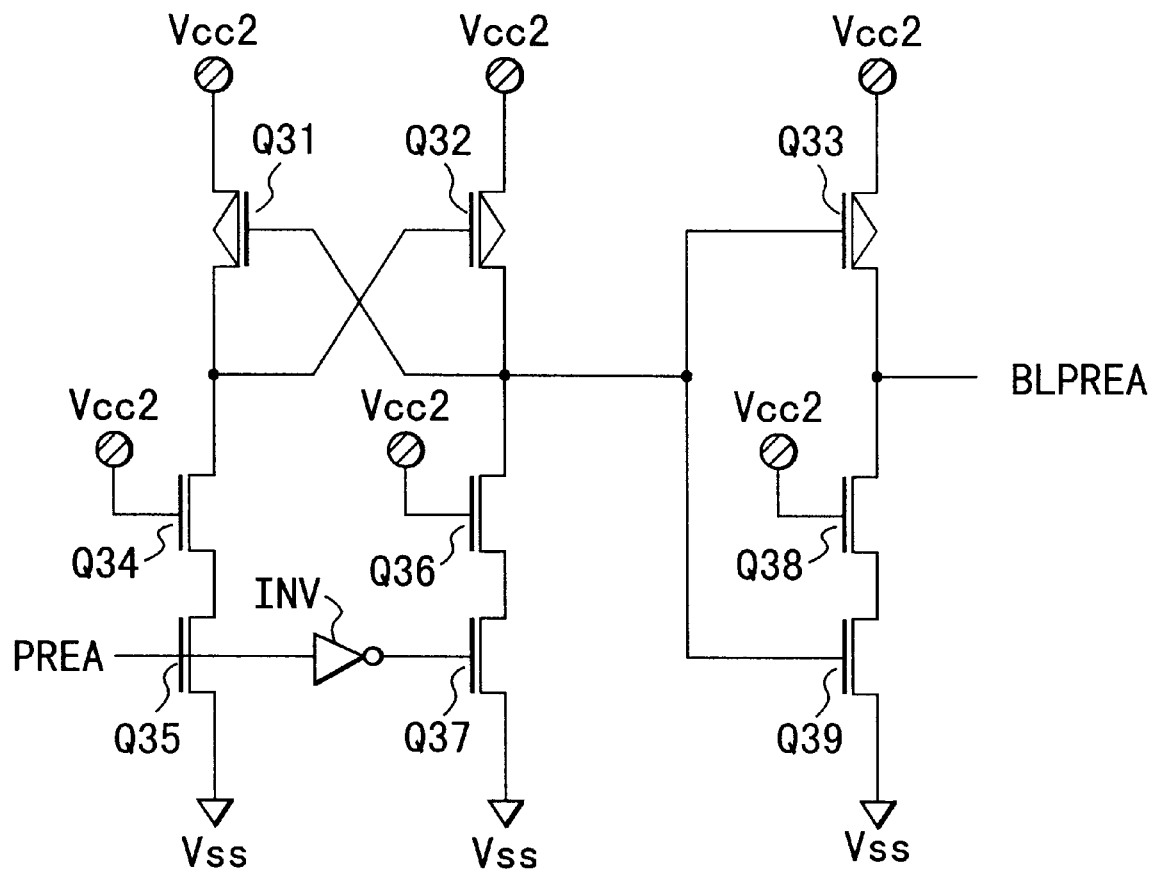
FIG. 12 is a circuit diagram showing an example of the construction of a bit line precharge circuit in the circuit shown in FIG. 10.

FIG. 12 is a circuit diagram showing an example of the construction of the bit line precharge circuit 9A in the circuit shown in FIG. 10. The circuit 9A includes p-channel transistors Q31 to Q33, n-channel transistors Q34 t Q39 and an inverter INV. The current paths of the transistors Q31, Q34, Q35 are serially connected between a node of the external power supply voltage Vcc2 and the power supply (ground node) Vss. Further, the current paths of the transistors Q32, Q36, Q37 are serially connected between the node of the external power supply voltage Vcc2 and the ground node Vss. The gate of the transistor Q31 is connected to the connection node of the current paths of the transistors Q32 and Q36 and the gate of the transistor Q32 is connected to the connection node of the current paths of the transistors Q31 and Q34. The gates of the transistors Q34, Q36 are connected to the node of the external power supply voltage Vcc2. A signal PREA is supplied to the gate of the transistor Q35 and the signal PREA is supplied to the gate of the transistor Q37 via the inverter INV.

Further, the current paths of the transistors Q33, Q38, Q39 are serially connected between the node of the external power supply voltage Vcc2 and the ground node Vss. The gates of the transistors Q33, Q39 are connected to the connection node of the current paths of the transistors Q32 and Q36 and the gate of the transistor Q38 is connected to the node of the external power supply voltage Vcc2. The connection node of the current paths of the transistors Q33 and Q38 is connected to the precharge line BLPREA.

The transistors Q34, Q36, Q38 are stress alleviating elements. Since the circuit 9A is operated on the external power supply voltage Vcc2, an element for alleviating the stress (electric field) applied to the transistor is inserted between the line to which the voltage Vcc2 is applied and the line of 0 V (Vss). In this case, the external power supply voltage Vcc2 is supplied to the gates of the transistors Q34, Q36, Q38, but the internal power supply voltage Vdd may be supplied or another stress alleviating element may be provided.

The bit line precharge circuit 9B has the same circuit construction as the bit line precharge circuit 9A.

Next, the operation of the NAND type EEPROM according to the second embodiment is explained.

Like the first embodiment, the data erasing operation and data readout operation in the NAND type EEPROM of the second embodiment are the same as the operation disclosed in, for example, "T. Tanaka et al.: IEEE J. Solid-State Circuit, vol. 29, pp. 1366–1373, 1994".

Figure 13:
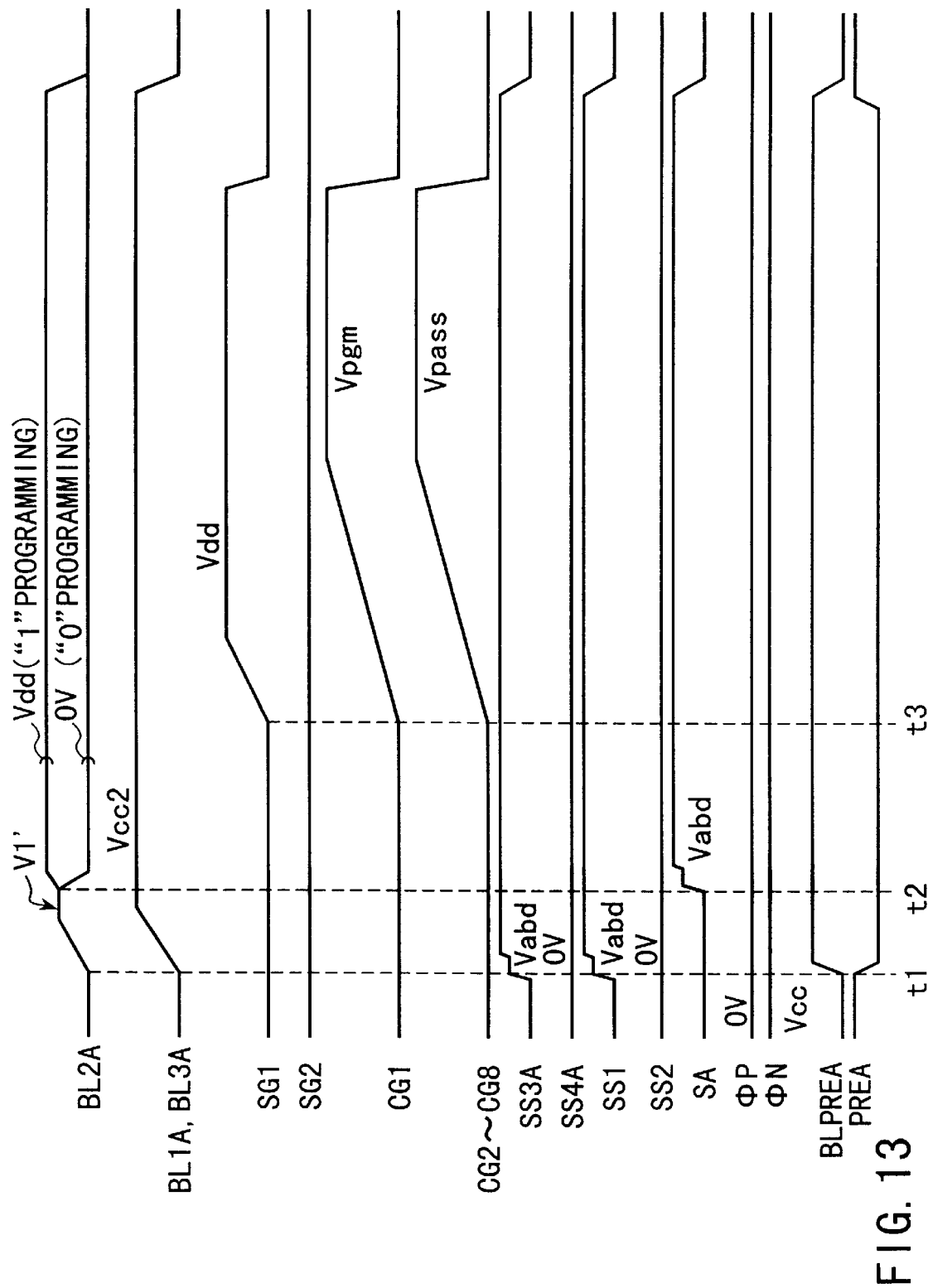
FIG. 13 is a timing chart for illustrating the programming operation of the NAND type EEPROM shown in FIGS. 10 to 12.

The data programming operation in the NAND type EEPROM is effected as follows. In this explanation, the programming procedure for programming data in the memory cell M12 shown in FIG. 2 is taken as an example. FIG. 13 is a timing chart showing the programming procedure.

As shown in FIG. 11, also in the second embodiment, two bit lines are commonly used by one sense amplifier. Therefore, one of the two bit lines is selected. For example, when data is programmed into the cell M12 shown in FIG. 2, the cells M11 and M13 which are adjacent to the cell M12 are set into the programming non-selection state. Data to be programmed into the cell M12 is supplied via the bit line BL2A and programming non-selection voltages are applied to the cells M11 and M13 via the bit lines BL1A and BL3A.

Figure 14A:
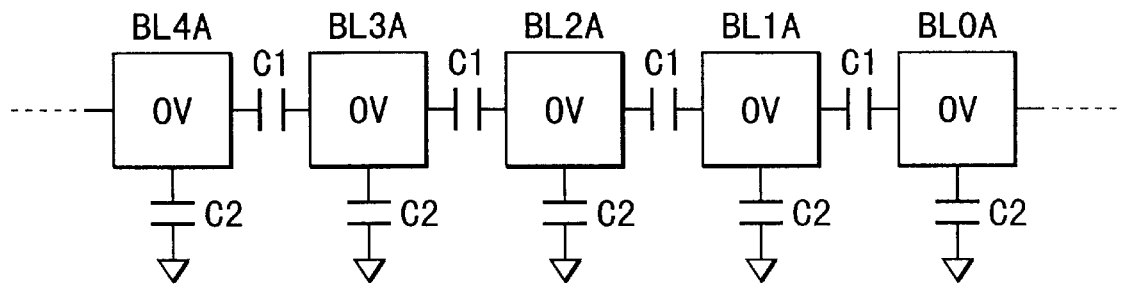
FIGS. 14A to 14C are equivalent circuit diagrams showing a variation in the voltage of the bit line during the programming operation of the NAND type EEPROM.

Data to be programmed into the cell M12 is latched in the sense amplifier circuit S/A1 shown in FIG. 11. That is, in the case of "0" programming, the nodes N1 and N2 of the sense amplifier circuit S/A1 are respectively set to "0 V" and "3 V", and in the case of "1" programming, the nodes N1 and N2 are respectively set to "3 V" and "0 V". At this time, the states of the bit lines are all set at OV as shown in FIG. 14A, for example.

Figure 14B:
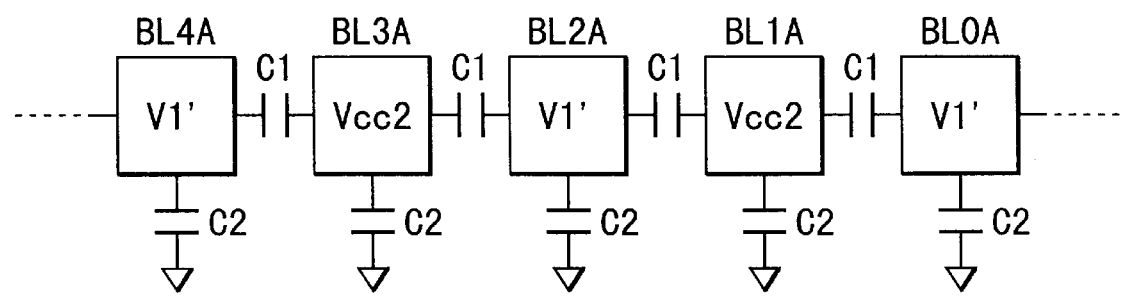

After this, if the programming operation is started, at the time t1 shown in FIG. 13, the signal SS3A is set to Vabd. The voltage Vabd may be such a voltage, for example, approx. 8 V for charging the bit lines BL1A, BL3A to Vcc2 (for example, 3 V). At this time, the bit line precharge activation signal PREA is set to the "Low" level and the precharge line BLPREA is charged to Vcc2. As a result, the bit lines BL1A, BL3A are charged to Vcc2. At this time, the bit line BL2A is set in the floating state. Therefore, as shown in FIG. 14B, the potential of the bit line BL2A is raised to a voltage V1' (approx. 2 V) by the capacitive coupling with the bit lines BL1A and BL3A by charging the bit lines BL1A, BL3A to Vcc2.

Figure 14C:
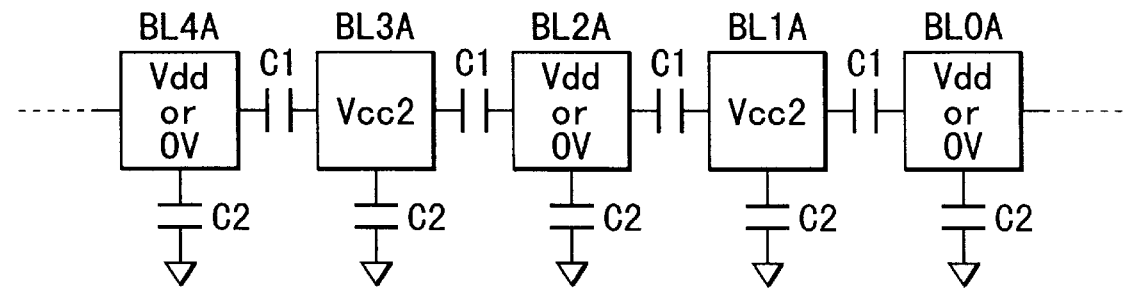

Then, at the time t2, the potential of the bit line BL2A is determined based on the programming data of the sense amplifier circuit S/A1. That is, in the case of "0" programming, the bit line BL2A is discharged to 0 V. In the case of "1" programming, the bit line BL2A is charged to Vdd (2.5 V) from 2 V. In FIG. 14C, the state in which the potential of the bit line BL2A is changed from 2 V and determined at 0 V or Vdd is shown.

Next, at the time t3, the voltages of the control gate lines CG1 to CG8 are raised. The potential of the selected control gate line CG1 is set at Vpgm (=approx. 20 V) and the voltages of the non-selected control gate lines CG2 to CG8 are raised to Vpass (=approx. 10 V) and, as a result, the channels of the memory cell MC12 into which "1" is to be programmed and the programming non-selection memory cells MC1, MC13 are set at the intermediate voltage (approx. 8 V) and the control gate CGl is set at Vpp (approx. 20 V) so that no electrons will be injected into the floating gates of the above memory cells. However, when "0" is to be programmed into the memory cell MC12, the channel is set at 0 V and the control gate line CG1 is set at Vpp (approx. 20 V) so that electrons may be injected from the substrate into the floating gate, thereby effecting the "0" programming process.

Thus, in the second embodiment, when the bit lines BL1A, BL3A are charged, the charging operation is effected by use of the external power supply voltage Vcc2, and therefore, a variation in the internal power supply voltage Vdd, that is, a lowering in the voltage can be prevented. Further, when "1" programming data is supplied to the bit line BL2A, the charging operation by the internal power supply voltage Vdd is only for 0.5 V from 2 V to 2.5 V, and therefore, a variation in the internal power supply voltage Vdd (a lowering in the voltage) can be significantly reduced at the time of "1" data programming in comparison with the conventional case wherein the bit line is charged from 0 V to 2.5 V.

Figure 15:
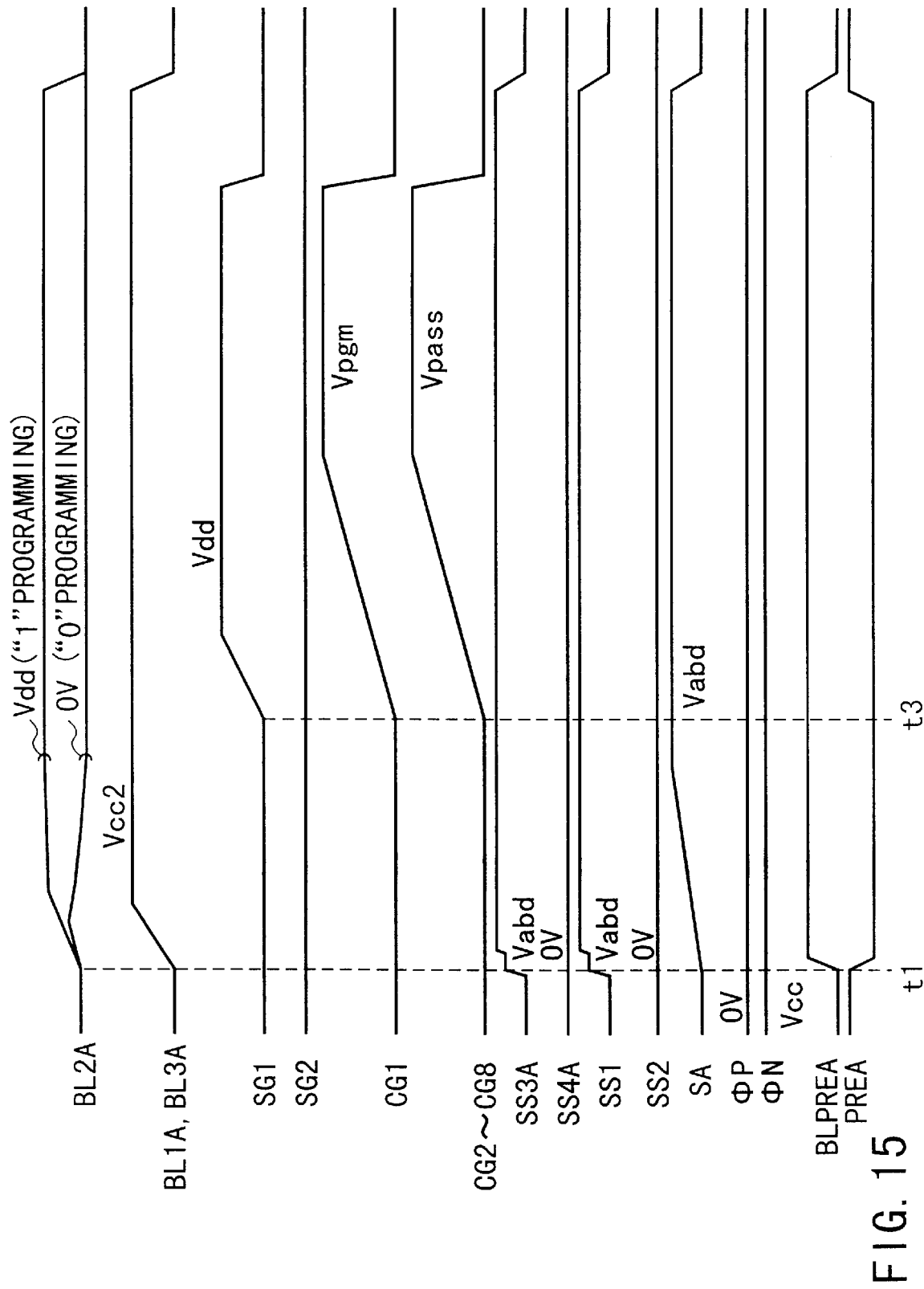
FIG. 15 is a timing chart for illustrating another programming operation of the NAND type EEPROM shown in FIGS. 10 to 12.

Next, another example of the programming operation is explained. FIG. 15 is a timing chart for illustrating another programming procedure. In the programming procedure shown in FIG. 15, the operation for charging the bit lines BL1A, BL3A and the operation for charging the bit line BL2A are simultaneously effected at the time t1. Further, the rising speeds of the signal SS3A and a voltage of the precharge line BLPREA are made high but the rising speed of the signal SA is made low. As a result, the potentials of the bit lines BL1A, BL3A rapidly rise and the potential of the bit line BL2A rapidly rises to 2 V by the capacitive coupling between the bit lines BL1A and BL3A. Then, the bit line BL2A is charged from 2 V to 2.5 V by the sense amplifier S/A1.

After the programming, the control gate, selection gate line, and bit lines are sequentially discharged and the programming operation is terminated.

This invention has been explained with reference to the first and second embodiments, but this invention is not limited to the first and second embodiments and can be variously modified without departing the technical scope thereof.

For example, in addition to the NAND type EEPROM in which NAND cells are integrated into a memory cell array, this invention can be applied to an EEPROM in which NOR type cells, AND type cells (H. Kume et al.: IEDM Tech. Dig., Dec. 1992, pp. 991–993; A. Nozoe: ISSCC, Digest of Technical Papers, 1995), DINOR type cells (S. Kobayashi: ISSCC, Digest of Technical Papers, 1995), or Virtual Ground Array type cells (Lee. et al.: Symposium on VLSI Circuits, Digest of Technical Papers, 1994) are integrated.

Further, this invention is not limited to the flash EEPROM, but this invention can be effectively applied to data programming in the other EEPROM, ultraviolet erasable EPROM, OTPROM, and mask ROM.

Further, data programming is not limited to the "substrate programming type" and can be applied to programming by channel thermoelectron injection used in the NOR type EEPROM, for example. Since the drain voltage of a memory cell can be set higher than the power supply voltage Vcc, for example, when this invention is applied to the channel thermoelectron injection, a voltage between the drain and source can be set high and a larger amount of channel thermoelectrons are generated in comparison with a case wherein the drain voltage is set at the power supply voltage Vcc, and as a result, the programming speed when electrons are injected into the floating gate may be enhanced. Of course, a high voltage generating circuit for raising the bit line voltage to the power supply voltage Vcc or more is not required and an increase in the chip area due to mounting of the high voltage generating circuit will not occur.

This invention is made to suppress the possibility that erroneous programming will occur in the "1" programming cell and programming non-selection cell, and in order to attain the above object, the construction for raising the bit line voltage to the power supply voltage Vcc or more can be realized without using the high voltage generating circuit as is explained in the first and second embodiments. Of course, the constructions explained in the above embodiments can be used in the operation of the EEPROM other than the data programming operation if the operation is to set the bit line voltage higher than the power supply voltage Vcc.

In addition, this invention can be applied not only to the binary memory but also to a multivalue memory.

Figure 16:
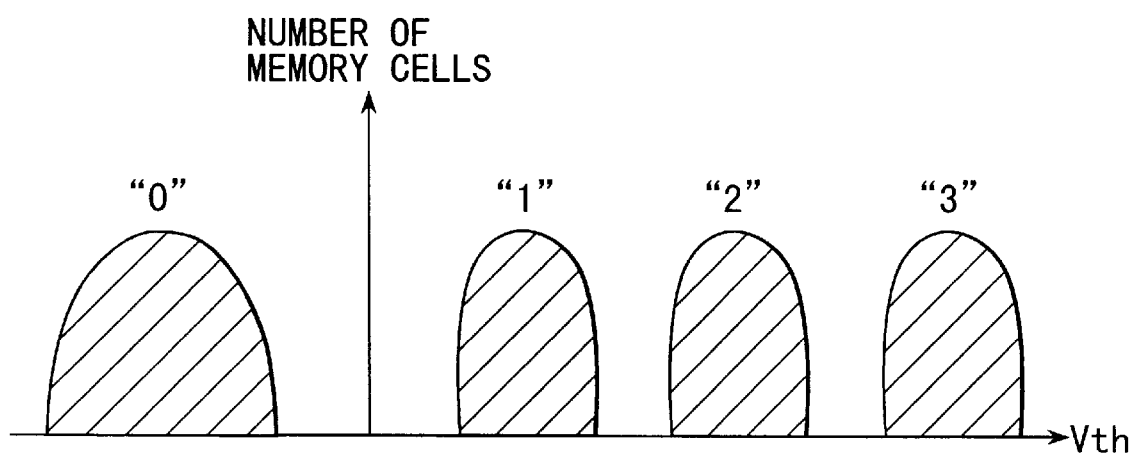
FIG. 16 is a diagram showing the distribution of threshold voltages of a four-value memory.
Figure 17:
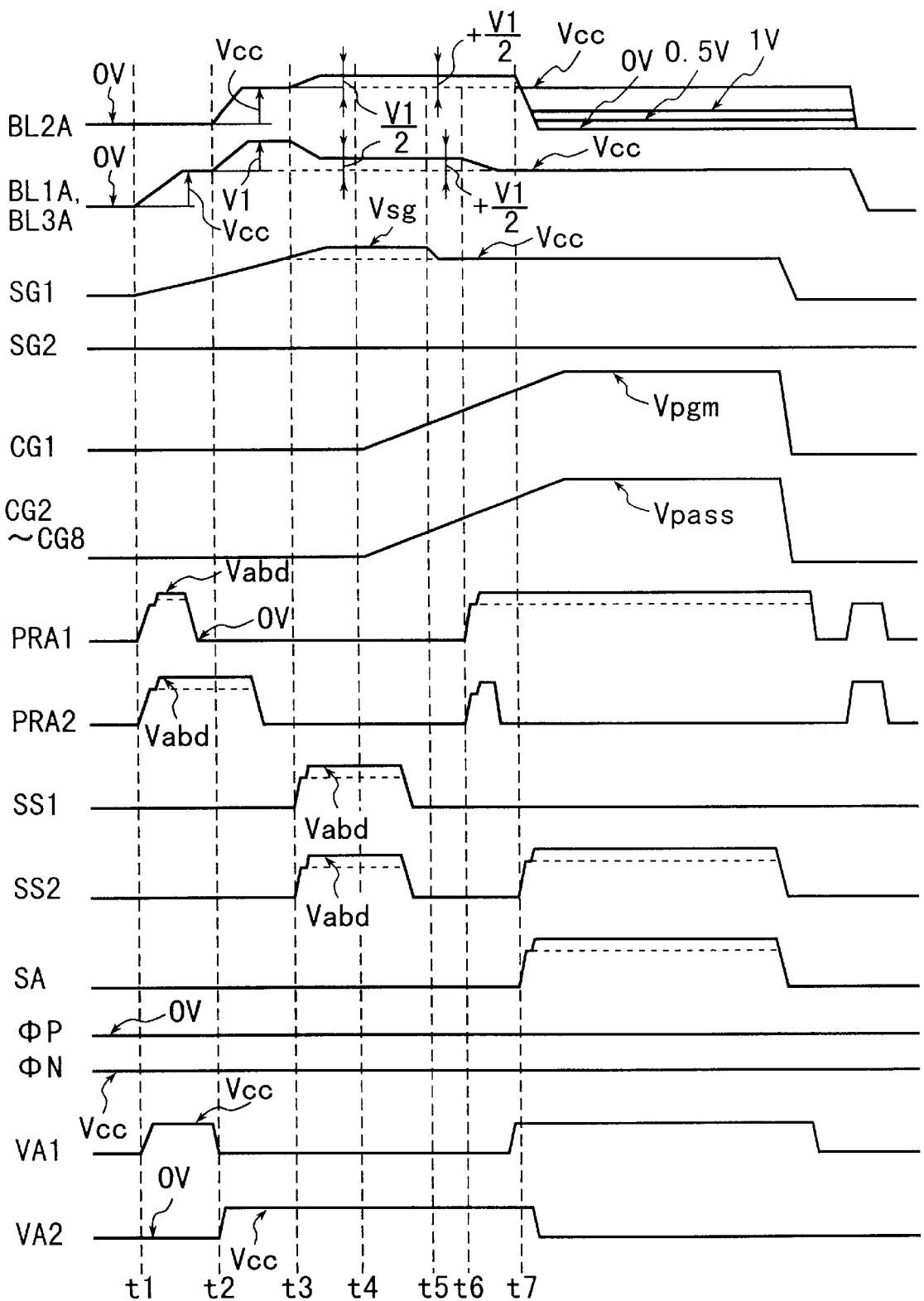
FIG. 17 is a timing chart for illustrating the programming operation when the NAND type EEPROM according to the first embodiment of this invention is a four-value memory.

For example, if the first embodiment is modified from the binary memory to a four-value memory which is one of the multivalue memories having the threshold voltage distribution as shown in FIG. 16, voltages corresponding to four programming data items, that is, "Vcc (programming non-selection)", "0 V ("3" programming in FIG. 16)", "0.5 V ("2" programming in FIG. 16)", and "1 V ("1" programming in FIG. 16)" may be applied to the bit line BL2A which supplies programming data at the time t7 as shown in FIG. 17.

Figure 18:
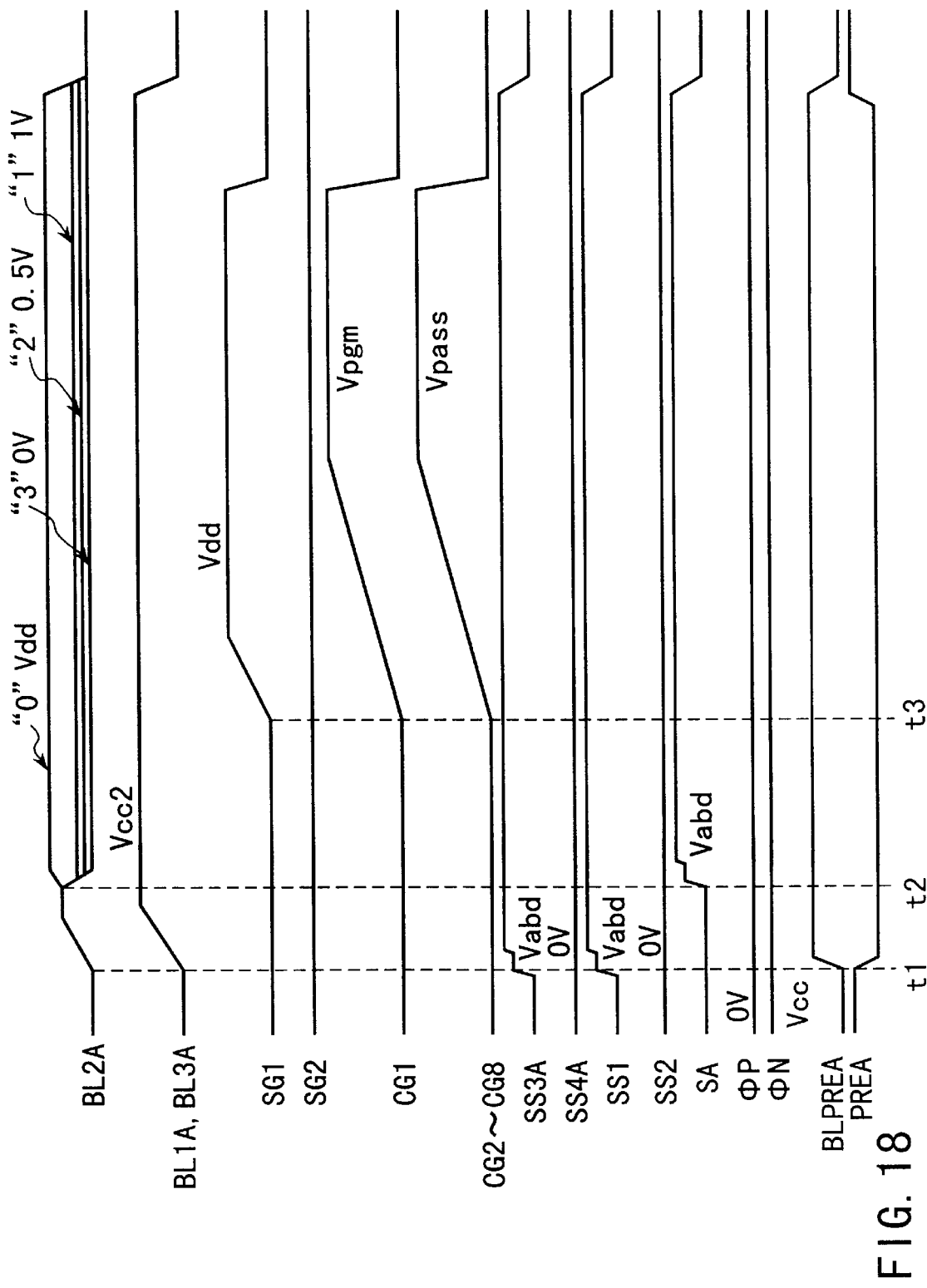
FIG. 18 is a timing chart for illustrating the programming operation when the NAND type EEPROM according to the second embodiment of this invention is a four-value memory.

Further, if the second embodiment is modified to a four-value memory, voltages corresponding to four programming data items, that is, "Vcc (programming non-selection)", "0 V ("3" programming in FIG. 16)", "0.5 V ("2" programming in FIG. 16)", and "1 V ("1" programming in FIG. 16)" may be applied to the bit line BL2A at the time t2 as shown in FIG. 18.

As described above, according to this invention, a nonvolatile semiconductor memory device can be provided in which high-speed data programming and low power consumption can be attained, the possibility of "erroneous programming" occurring in the "1" programming cell (programming non-selection cell) connected to the word line selected for programming can be suppressed and a lowering in the internal power supply voltage Vdd can be suppressed without increasing the chip area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A nonvolatile semiconductor memory device comprising:
   a memory cell section including at least one nonvolatile memory cell;
   a first signal line connected to one end of said memory cell section; and
   a second signal line capacitively coupled with said first signal line;
   wherein said first signal line is set to a first voltage, thereafter rendered electrically floating, and then the voltage of said first signal line is changed to a third voltage different from the first voltage by changing the voltage of said second signal line to a second voltage after said first signal line is rendered electrically floating.

2. A nonvolatile semiconductor memory device according to claim 1, wherein said first signal line and said second signal line are connected to each other to change the voltage of said first and second signal lines to a fourth voltage after the voltage of said first signal line is changed to the third voltage.

3. A nonvolatile semiconductor memory device according to claim 2, wherein said first signal line or said second signal line is changed to a fifth voltage after the voltages of said first and second signal lines are changed to the fourth voltage.

4. A nonvolatile semiconductor memory device according to claim 2, wherein the fourth voltage is higher than a power supply voltage.

5. A nonvolatile semiconductor memory device according to claim 2, wherein the first and second voltages are power supply voltages.

6. A nonvolatile semiconductor memory device according to claim 1, wherein said first signal line is changed to a fifth voltage after the voltage of said first signal line is changed to the third voltage.

7. A nonvolatile semiconductor memory device according to claim 1, wherein the first and second voltages are power supply voltages.

8. A nonvolatile semiconductor memory device according to claim 1, wherein the first voltage is 0 V.

9. A nonvolatile semiconductor memory device according to claim 1, wherein said first and second signal lines are bit lines.

10. A nonvolatile semiconductor memory device comprising:
    a memory cell section including at least one nonvolatile memory cell;
    a first signal line connected to one end of said memory cell section; and
    a second signal line capacitively coupled with said first signal line;
    wherein said first signal line is set to a first voltage, thereafter rendered electrically floating, and then the voltage of said first signal line is changed from the first voltage to an unselected programming voltage by changing the voltage of said second signal line to a second voltage after said first signal line is rendered electrically floating.

11. A nonvolatile semiconductor memory device according to claim 10, which further comprises a data latch circuit for storing programming data into said memory cell section and wherein the voltage of one of said first and second signal lines set at the unselected programming voltage is changed to a preset programming voltage according to programming data stored in said data latch circuit.

12. A nonvolatile semiconductor memory device according to claim 11, wherein the unselected programming voltage is transferred to said memory cell section before the voltage of one of said first and second signal lines is changed to the preset programming voltage.

13. A nonvolatile semiconductor memory device according to claim 10, wherein the unselected programming voltage is higher than a power supply voltage.

14. A nonvolatile semiconductor memory device according to claim 10, wherein the first and second voltages are power supply voltages.

15. A nonvolatile semiconductor memory device according to claim 10, wherein said first and second signal lines are bit lines.

16. A nonvolatile semiconductor memory device comprising:
    a memory cell section including at least one nonvolatile memory cell;
    a first signal line connected to one end of said memory cell section; and
    a second signal line capacitively coupled with said first signal line;
    wherein said first signal line is set to a first voltage, thereafter rendered electrically floating, and the voltage of said first signal line is changed to a third voltage different from the first voltage by changing the voltage of said second signal line to a second voltage after said first signal line is rendered electrically floating, and then said first signal line and said second signal line are connected to each other to set the voltages of said first and second signal lines to an unselected programming voltage after the voltage of said first signal line is set to the third voltage.

17. A nonvolatile semiconductor memory device according to claim 16, which further comprises a data latch circuit for storing data to be programmed into said memory cell section and wherein the voltage of one of said first and second signal lines set at the unselected programming voltage is changed to a preset programming voltage according to programming data stored in said data latch circuit.

18. A nonvolatile semiconductor memory device according to claim 17, wherein the unselected programming voltage is transferred to said memory cell section before the voltage of one of said first and second signal lines is changed to the preset programming voltage.

19. A nonvolatile semiconductor memory device according to claim 16, wherein the unselected programming voltage is higher than a power supply voltage.

20. A nonvolatile semiconductor memory device according to claim 16, wherein the first and second voltages are power supply voltages.

21. A nonvolatile semiconductor memory device according to claim 16, wherein said first and second signal lines are bit lines.

22. A nonvolatile semiconductor memory device comprising:

a memory cell section including at least one nonvolatile memory cell;

a first signal line connected to one end of said memory cell section;

a second signal line capacitively coupled with said first signal line; and a data latch circuit for storing data to be programmed into said memory cell section;

wherein said first signal line is set to a first voltage, thereafter rendered electrically floating, then the voltage of said first signal line is changed to a third voltage different from the first voltage by changing the voltage of said second signal line to a second voltage after said first signal line is rendered electrically floating, and the voltage of said first signal line is changed to a preset programming voltage according to programming data stored in said data latch circuit after the voltage of said first signal line is changed to the third voltage.

23. A nonvolatile semiconductor memory device according to claim 22, which further comprises a bias circuit for biasing said second signal line and wherein the second voltage is supplied from said bias circuit.

24. A nonvolatile semiconductor memory device according to claim 23, wherein the second voltage supplied from said bias circuit to said second signal line is an external power supply voltage and the preset programming voltage supplied from said data latch circuit to said first signal line contains an internal power supply voltage.

25. A nonvolatile semiconductor memory device according to claim 24, which further comprises a voltage lowering circuit wherein said voltage lowering circuit supplies the internal power supply voltage which is lower than the external power supply voltage.

26. A nonvolatile semiconductor memory device according to claim 25, wherein the external power supply voltage is supplied to said bias circuit via a first power supply terminal and the external power supply voltage is supplied to said voltage lowering circuit via a second power supply terminal different from said first power supply terminal.

27. A nonvolatile semiconductor memory device according to claim 22, wherein the first voltage is 0 V.

28. A nonvolatile semiconductor memory device according to claim 22, wherein said first and second signal lines are bit lines.

* * * * *

UNITED STATES PATENT AND TRADEMARK OFFICE
CERTIFICATE OF CORRECTION

PATENT NO. : 6,005,802

DATED : December 21, 1999

INVENTOR(S) : Ken TAKEUCHI, et al.

It is certified that error appears in the above-identified patent and that said Letters Patent is hereby corrected as shown below:

On the cover page, and in col. 1, in the Title:
please delete "NONVOLATILE SEMICONDUCTOR MEMORY DEVICE USING A BIT LINE POTENTIAL RAISED BY USE OF A COUPLING CAPACITOR BETWEEN BIT LINES" and insert --NONVOLATILE SEMICONDUCTOR MEMORY DEVICE CAPABLE OF CONTROLLING PROGRAM DISTURB BY A COUPLING CAPACITOR BETWEEN THE BIT LINES--.

On the cover page, [56] under OTHER PUBLICATIONS, line 8, delete "Self-Booosting" and insert
--Self-Boosting-- therein; and
line 9, replace "285-286" with --283-286--.

In Claim 1, column 17, line 18, after "cell" insert --having two diffusion layers--;
line 20, after " section" insert --and supplying a signal to one of the two diffusion layers--;
line 22, delete ";" and insert --,--;
line 23, after "wherein" insert --a voltage of--; and
line 26, delete "the" (second occurrence) and insert --a--.

In Claim 9, Column 17, line 57, after "first" insert --signal line is a bit line-- and
delete "lines are" and insert --line is a--.
line 58, delete "lines" and insert --line adjacent to said first signal line--.

In Claim 10, column 17, line 62, after "cell" insert --having two diffusion layers--,
line 66, delete ";" and insert --,--; and
column 18, line 1, after "wherein" insert --a voltage of--; and
line 5, delete "the" and insert --a--.

In Claim 15, column 18, line 27, after "first" insert --signal line is a bit line-- and after "signal" delete "lines are" and insert --line is a --; and
line 28, delete "lines" and insert --line adjacent to said first signal line--.

UNITED STATES PATENT AND TRADEMARK OFFICE
CERTIFICATE OF CORRECTION

PATENT NO. : 6,005,802
DATED : December 21, 1999
INVENTOR(S) : Ken TAKEUCHI, et al.

It is certified that error appears in the above-identified patent and that said Letters Patent is hereby corrected as shown below:

In Claim 16, column 18, line 32, after "cell" insert --having two diffusion layers--;
    line 36, delete ";" and insert --,--;
    line 37, after "wherein" insert --a voltage of--; and
    line 40, delete "the" with --a--.

In Claim 21, column 18, line 67, after "first" insert --signal line is a bit line-- and
    delete "lines are" and insert --line is a--; and
    line 68, delete "lines" and insert --line adjacent to said first signal line--.

In Claim 22, column 19, line 4, after "cell" insert --having two diffusion layers--;
    line 10, delete ";" and insert --,--;
    line 11, after "wherein" insert --a voltage of--; and
    line 14, delete "the" and insert --a--.

In Claim 28, column 20, line 21, after "first" insert --signal line is a bit line-- and
    delete "lines are" and insert --line is a--; and
    line 22, delete "lines" and insert --line adjacent to said first signal line--.

Column 20, after line 22, Insert Claims 29 and 30:
    --29. A nonvolatile semiconductor memory device according to claim 3, wherein,
        when one of said first signal line and said second signal line is changed to the fifth voltage,
        the other one of said first signal line and said second signal line is rendered
        electrically floating.--.

UNITED STATES PATENT AND TRADEMARK OFFICE
CERTIFICATE OF CORRECTION

| | | |
|---|---|---|
| PATENT NO. | : 6,005,802 | |
| DATED | : December 21, 1999 | |
| INVENTOR(S) | : Ken TAKEUCHI, et al. | |

It is certified that error appears in the above-identified patent and that said Letters Patent is hereby corrected as shown below:

30. A nonvolatile semiconductor memory device according to claim 17, wherein, when one of said first signal line and said second signal line is changed to the preset programming voltage, the other one of said first signal line and said second signal line is rendered electrically floating.--.

Signed and Sealed this

Twenty-first Day of November, 2000

Attest:

Q. TODD DICKINSON

*Attesting Officer*  *Director of Patents and Trademarks*